(12) United States Patent
Luan

(10) Patent No.: US 11,222,681 B2
(45) Date of Patent: Jan. 11, 2022

(54) 3D STACKED HIGH-DENSITY MEMORY CELL ARRAYS AND METHODS OF MANUFACTURE

(71) Applicant: TC Lab, Inc., Gilroy, CA (US)

(72) Inventor: Harry Luan, Saratoga, CA (US)

(73) Assignee: TC Lab, Inc., San Francisco, CA (US)

( * ) Notice: Subject to any disclaimer, the term of this patent is extended or adjusted under 35 U.S.C. 154(b) by 55 days.

(21) Appl. No.: 16/861,065

(22) Filed: Apr. 28, 2020

(65) Prior Publication Data

US 2020/0258562 A1 Aug. 13, 2020

Related U.S. Application Data

(62) Division of application No. 16/033,190, filed on Jul. 11, 2018, now Pat. No. 10,636,473.

(60) Provisional application No. 62/551,742, filed on Aug. 29, 2017, provisional application No. 62/531,319, filed on Jul. 11, 2017.

(51) Int. Cl.
| | |
|---|---|
| *G11C 11/39* | (2006.01) |
| *H01L 27/108* | (2006.01) |
| *H01L 27/102* | (2006.01) |
| *H01L 27/105* | (2006.01) |
| *H01L 29/74* | (2006.01) |
| *H01L 29/87* | (2006.01) |
| *H01L 29/06* | (2006.01) |
| *H01L 29/66* | (2006.01) |

(52) U.S. Cl.
CPC .......... *G11C 11/39* (2013.01); *H01L 27/1023* (2013.01); *H01L 27/1027* (2013.01); *H01L 27/1052* (2013.01); *H01L 27/10844* (2013.01); *H01L 29/0657* (2013.01); *H01L 29/66363* (2013.01); *H01L 29/74* (2013.01); *H01L 29/87* (2013.01)

(58) Field of Classification Search
None
See application file for complete search history.

(56) References Cited

U.S. PATENT DOCUMENTS

| | | | |
|---|---|---|---|
| 9,502,434 B2 * | 11/2016 | Tanaka | H01L 29/7869 |
| 2012/0205713 A1 | 8/2012 | Tang | |
| 2017/0229465 A1 | 8/2017 | Luan et al. | |
| 2018/0053766 A1 | 2/2018 | Luan et al. | |
| 2019/0013317 A1 | 1/2019 | Luan et al. | |

FOREIGN PATENT DOCUMENTS

CN 104103578 B * 7/2018 ......... H01L 21/7685

* cited by examiner

*Primary Examiner* — Steven M Christopher
(74) *Attorney, Agent, or Firm* — Aka Chan LLP

(57) ABSTRACT

Integrated circuit devices having multiple level arrays of thyristor memory cells are created using a stack of ONO layers through which NPNPNPN layered silicon pillars are epitaxially grown in-situ. Intermediate conducting lines formed in place of the removed nitride layer of the ONO stack contact the middle P-layer of silicon pillars. The silicon pillars form two arrays of thyristor memory cells, one stacked upon the other, having the intermediate conducting lines as common connections to both arrays. The stacked arrays can also be provided with assist-gates.

4 Claims, 29 Drawing Sheets

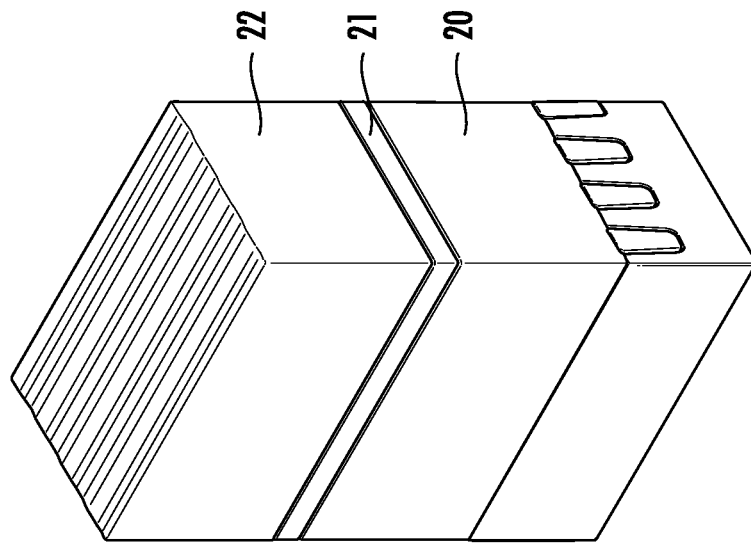
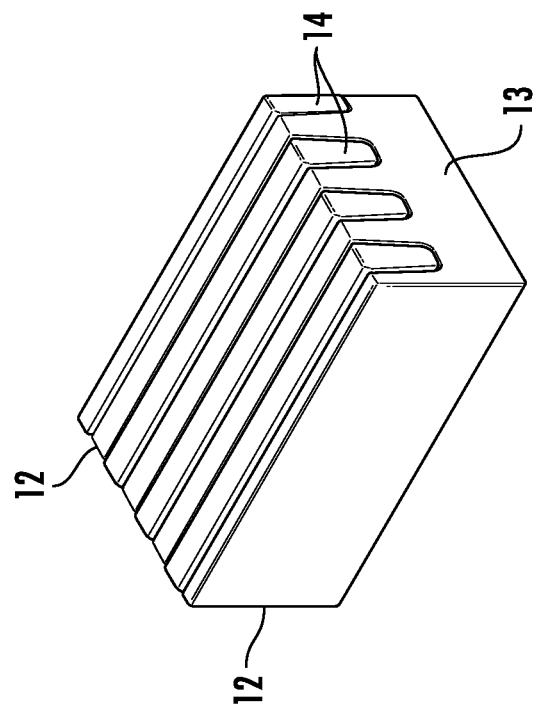
FIG. 5B
FIG. 5A

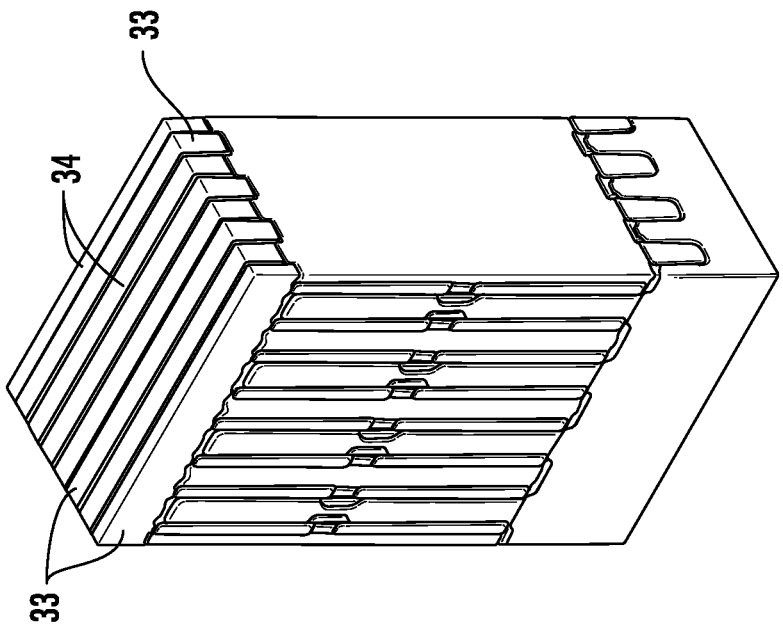
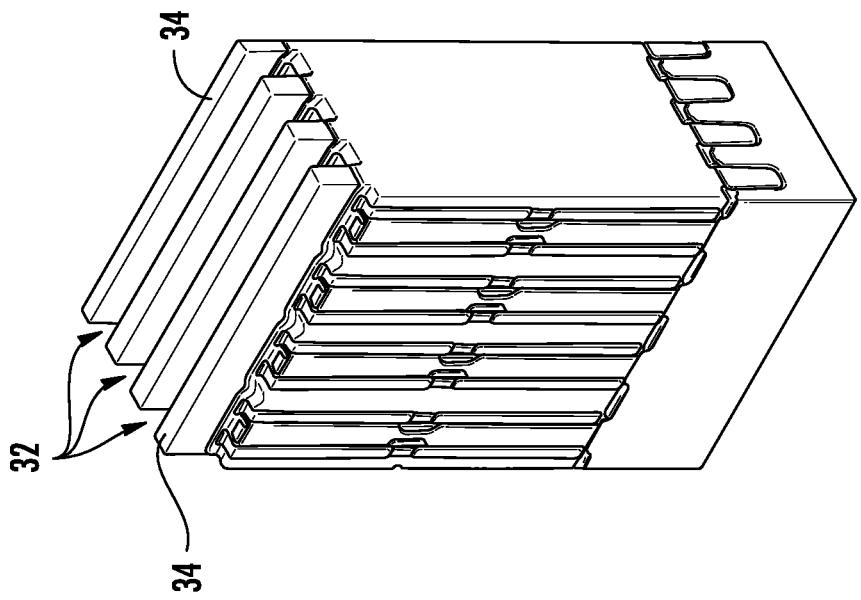

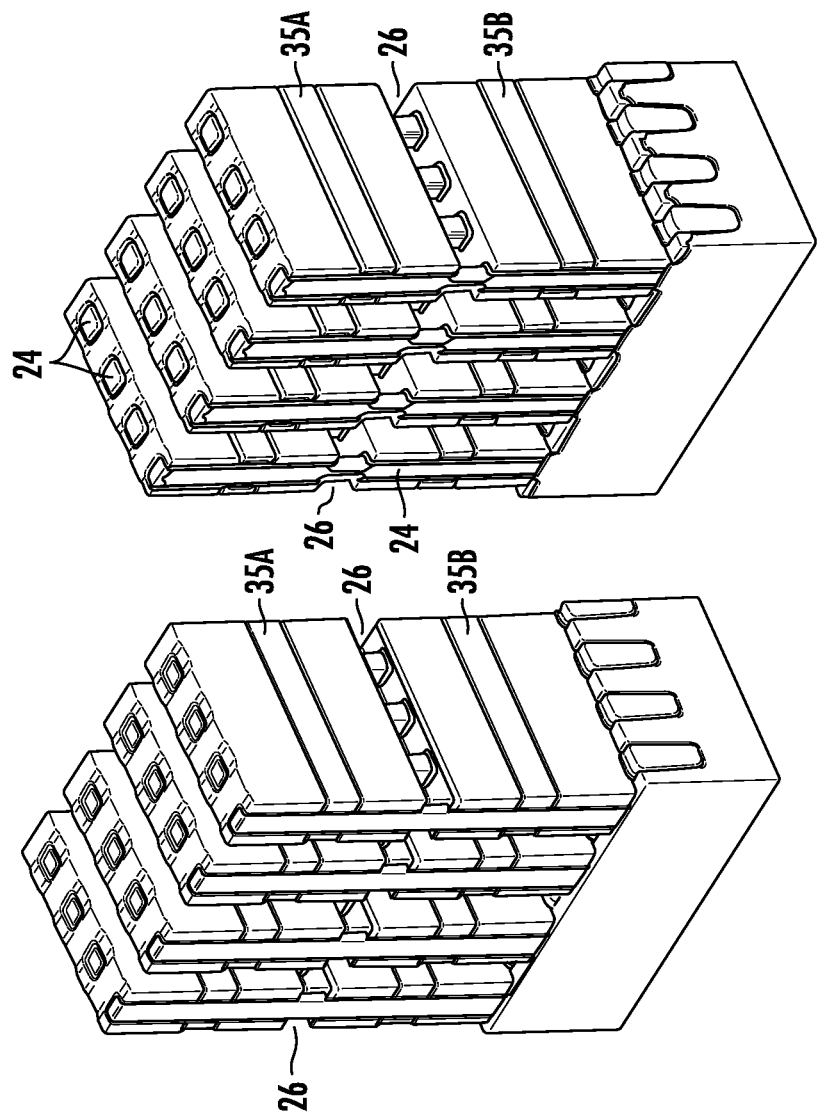

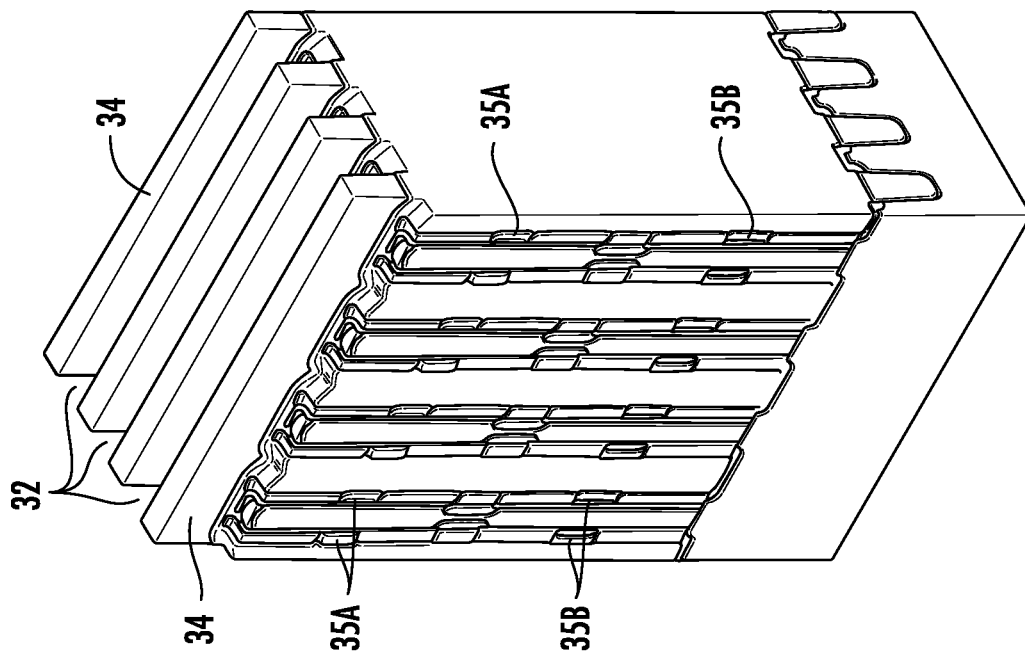
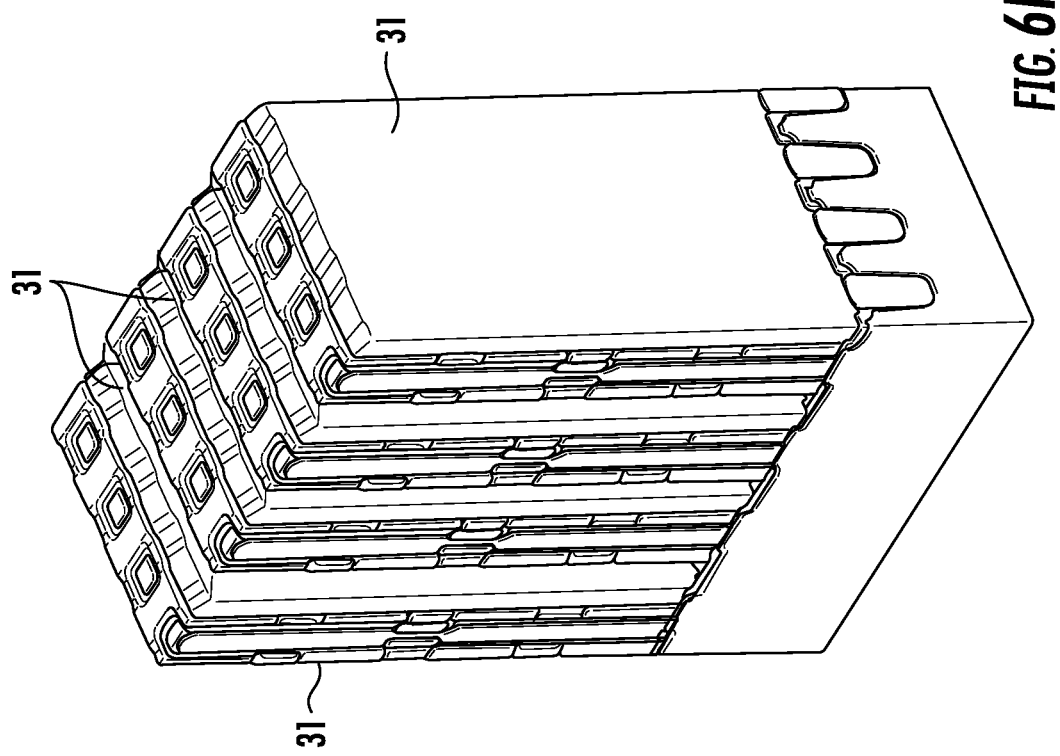
FIG. 6K
FIG. 6L

3D STACKED HIGH-DENSITY MEMORY CELL ARRAYS AND METHODS OF MANUFACTURE

CROSS-REFERENCE TO RELATED APPLICATIONS

This patent application is a divisional of U.S. patent application Ser. No. 16/033,190, entitled 3D Stacked High-Density Memory Cell Arrays and Methods of Manufacture, filed Jul. 11, 2018, issued as U.S. Pat. No. 10,636,473 on Apr. 28, 2020, which claims priority to U.S. Provisional Patent Application No. 62/531,319, entitled "3D Stacked High-Density Volatile RAMs and Methods of Manufacture," filed Jul. 11, 2017; and U.S. Provisional Patent Application No. 62/551,742, entitled "Method of Making Electrical Connections in 3 Dimensional Semiconductor Devices," filed Aug. 29, 2017; all of which are incorporated by reference.

BACKGROUND OF THE INVENTION

This invention relates to semiconductor devices for information storage. In particular, the invention relates to three-dimensional arrays of vertical thyristors in dynamic random access memories (DRAMs) and methods for fabrication of such memories.

Various DRAM semiconductor cell structures have been proposed using thyristors. The assignee herein describes several thyristor semiconductor structures for DRAMs, and the processes for manufacturing them in various commonly assigned patent applications. See, e.g., U.S. Patent Application 62/530,785, filed Jul. 10, 2017, and entitled "Vertical Thyristor Dynamic Random Access Memory Cell and Methods of Fabrication," incorporated by reference herein.

The one-transistor/one-capacitor (1T1C) cell has been essentially the only memory cell used in DRAM devices for the last 30 years. Bit density has quadrupled approximately every 3 years by lithographical scaling and ever increasing process complexity. Maintaining the capacitance value and low transistor leakage have become a major problem for further reductions in cell area.

Recently alternative DRAM cells have been proposed to overcome the scaling challenges of conventional 1T1C DRAM technology. These include floating body DRAM (FBDRAM), a single MOSFET built on either a silicon-on-insulator (Okhonin, Int. SOI Conf., 2001) or in triple-well with a buried n-implant (Ranica, VLSI Technology, 2004). These technologies have yet to solve data retention issues, particularly in small geometry cells.

Various cell designs have been proposed based on the negative differential resistance (NDR) behavior of a PNPN thyristor. An active or passive gate is often used in these designs to optimize trade-offs among switching speed, retention leakage, or operation voltage. The thin capacitively-coupled thyristor (TCCT), as disclosed by U.S. Pat. No. 6,462,359, is a lateral PNPN thyristor constructed on a SOI substrate and has a coupling gate for increased switching speed. Due to its lateral 2D design and the need of a gate, the cell size is larger than the 1T1C cell which is about $6{\sim}8F^2$.

Recently, Liang in U.S. Pat. No. 9,013,918 disclosed a PNPN thyristor cell that is constructed on top of silicon substrate and operated in forward and reverse breakdown region for writing data into the cell. The use of epitaxial or CVD semiconductor layers at the backend of the standard CMOS process, add-on thermal cycles and etch steps can degrade performance and yield of devices already formed on, or in, the substrate. In addition, PNPN devices operated in the breakdown regime pose challenges in process control and power consumption.

The assignee of this application previously disclosed thyristor memory cells built in a bulk semiconductor substrate used as reference for cell physics and operations. It is advantageous, however, to be able to stack the thyristor cells for multiple layers of memory arrays. This application discloses new 3D stacked thyristor cells, arrays, and sample manufacturing process flows.

This application describes improvements over the technology described in that application.

BRIEF SUMMARY OF THE INVENTION

The present invention provides for an integrated circuit device having a plurality of thyristor memory cell arrays. The device has a set of first parallel conducting lines; a set of second parallel conducting lines; an array of semiconductor pillars; and a set of intermediate conducting lines. The pillars have layers of alternating polarity with first and second end layers at first and second ends of the pillars having the same polarity and a middle layer of opposite polarity. Each first end of a semiconductor pillar is connected to a first parallel conducting line and each second end of a semiconductor pillar is connected to a second parallel conducting line. Each middle layer of a semiconductor pillar is connected to an intermediate conducting line so that the semiconductor pillar forms a first thyristor between a first parallel conducting line and the intermediate conducting line, and a second thyristor between a second parallel conducting line and the intermediate conducting line whereby a first thyristor of a semiconductor pillar is part of a first thyristor memory cell array and the second thyristor of the semiconductor pillar is part of a second thyristor memory cell array below the first thyristor memory cell array. The semiconductor pillars comprise epitaxially grown semiconductor materials with in-situ doped layers of alternating polarity.

The present invention also provides for a method of forming an electrical connection to a region between a lower layer of semiconductor structure and an upper layer of semiconductor structure. The method has the steps of: providing an intermediate layer structure of insulating material between the lower layer and the upper layer of semiconductor structure; forming an opening extending through the upper layer, the intermediate layer structure and at least some of the lower layer; filling the opening with a semiconductor material; removing at least a portion of the intermediate layer structure to create a space between the upper layer and the lower layer; forming a metal silicide layer with the semiconductor material in the space; and introducing a first metal into the space to connect to the metal silicide layer.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 5A-5L illustrate manufacturing steps in the process flow to fabricate the semiconductor device of FIG. 1.

It should be noted that the same reference numerals are used in different figures to indicate the same element or an element similar to an element in a previous drawing to facilitate a better understanding of the present invention.

DETAILED DESCRIPTION OF THE INVENTION

3D Stacked Memory Cell Arrays

Figure 1:
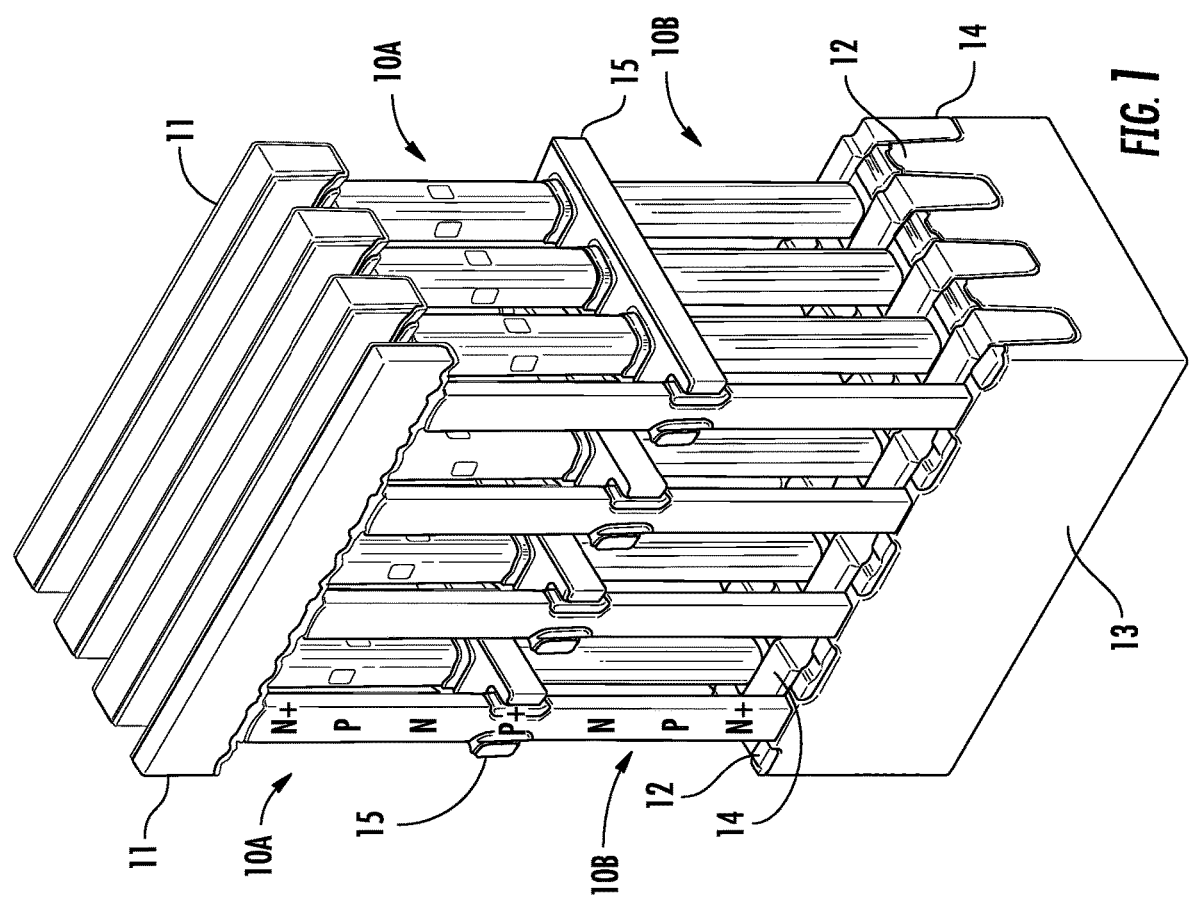
FIG. 1 is a perspective view of a two-array stack of thyristor memory cells.

FIG. 1 is a perspective diagram illustrating a portion of a memory cell array according to one embodiment of present invention. The FIG. 1 array is not a complete integrated circuit device, but shows a portion of the array completed with the process steps of the embodiments of the invention.

FIG. 1 shows an integrated circuit device with a 3D stacked thyristor memory cell arrays according to one embodiment of the present invention. The dielectric material has been omitted in the FIG. 1 perspective view to better illustrate the arrangement of a first set of memory cells 10A stacked above a second set of memory cells 10B. The top set of cells 10A are interconnected with top cathode lines 11 and intermediate level anode lines 15, and the bottom set of cells 10B are interconnected with the intermediate level anode lines 15 and bottom cathode lines 12. That is, each memory cell 10A, formed as a pillar of NPNP semiconductor layers, is connected to a cathode line 11 at memory cell's top N+ layer (cathode) and to an anode line 15 at the memory cell's bottom P+ layer. Each memory cell 10B, a pillar of PNPN semiconductor layers, is connected to an anode line 15 at the memory cell's top P+ layer and to a cathode line 12 at the memory cell's bottom N+ layer.

The bottom cathode lines 12 are formed by doped regions, not shown, isolated by isolation trenches 14 in a semiconductor substrate 13. The top cathode lines 11 are metal lines parallel to the bottom cathode lines 12. The intermediate level anode lines 15 are metal lines which are perpendicular to the cathode lines 11 and 12. A pair of memory cells 10A and 10B is formed by a pillar of NPNPNPN semiconductor layers with a top cathode line 11 connected to one N region at an end of the pillar and a bottom cathode line 12 connected to the N region at the opposite end of the pillar. An intermediate level anode line 15 is connected to the center P region of the pillar so that the pillar is divided into the top thyristor memory cell 10A and the bottom thyristor memory cell 10B connected to a common anode 15.

A further understanding of the structure and arrangement of the 3D stacked thyristor memory cell array of FIG. 1 may be achieved by a perusal of the manufacturing steps for the FIG. 1 array shown in FIGS. 5A-5L and the accompanying description below. It should also be noted that the polarities of the semiconductor layers can be reversed from NPNPNPN as shown in FIG. 1 to PNPNPNP semiconductor layers. Then the top and bottom lines 11, 12 become anode lines and the intermediate level line 15 becomes a cathode line.

Figure 2:
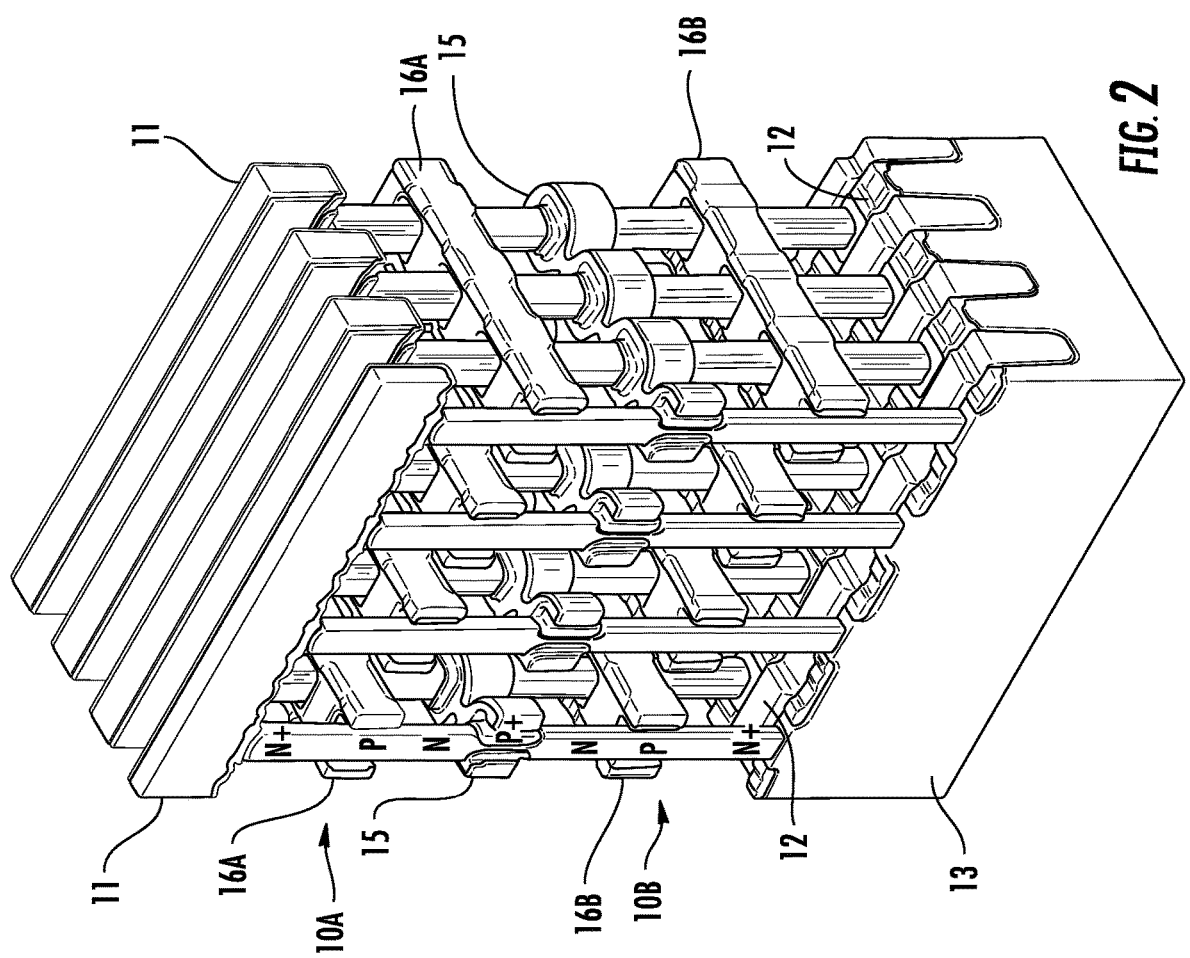
FIG. 2 is a perspective of a two-array stack of thyristor memory cells with assist-gates in each array.

FIG. 2 shows in perspective view the memory cell array with assist-gates which speed the switching of the thyristor memory cells from one logic state to the other. Assist-gates are described in patents granted to the present assignee, such as U.S. Pat. No. 9,613,968, which issued Apr. 4, 2017, and U.S. Pat. No. 9,564,199, which issued Feb. 7, 2017, which are incorporated by reference herein. The disclosed structure is similar to that of FIG. 1 but includes top assist-gate electrodes 16A and bottom assist-gate electrodes 16B which respectively couple to a base region (a P-type base region is shown) of the thyristor memory cells 10A and 10B. A reversal of polarities of the layers of the thyristor memory cells changes the base region to which the assist-gate electrodes are coupled.

Figure 3:
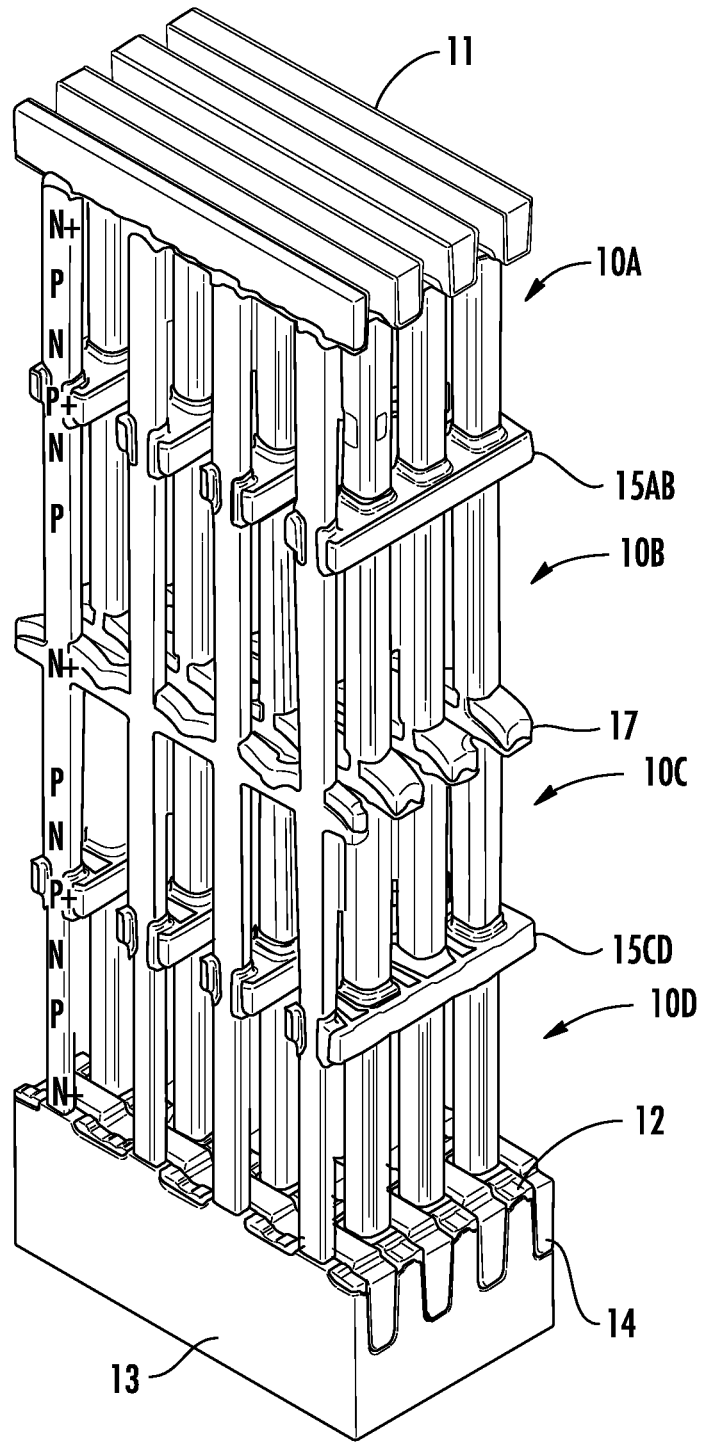
FIG. 3 is a perspective view of a four-array stack of thyristor memory cells.

FIG. 3 shows a stack of four thyristor memory cell arrays which has many of the previously described features extended to the 4-layer stack. Furthermore, multiple layer stacks can be constructed by repeating the process steps, as also shown in the figures.

Methods of Manufacturing 3D Thyristor Memory Cell Arrays

Preferred methods for fabricating the stacked arrays of thyristor memory cells are described below with illustrations in FIGS. 5-10. Some details and process steps are omitted as they are well-known to practitioners in the semiconductor field. Other alternative steps are also discussed below. It should be noted that in the description below semiconductor device may refer to the array of thyristor memory cells at various stages of fabrication.

Process Flow for Two-Level Memory Cell Array

Figure 5D:
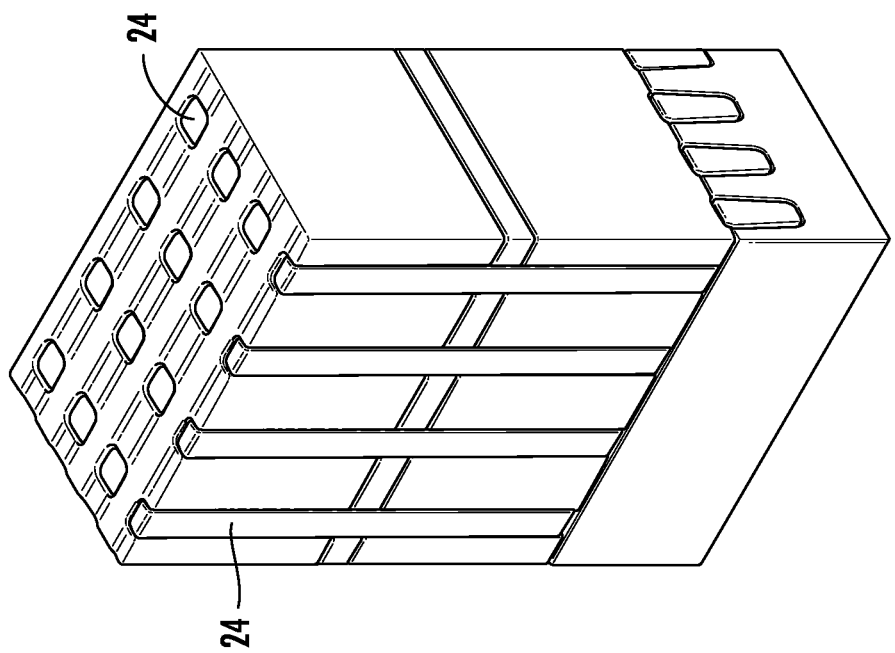

FIGS. 5A-5L illustrate steps in manufacturing a two-level array of thyristor memory cells exemplified by FIG. 1. To start the manufacturing process, shallow trench isolation (STI) 14 are first formed in the P-type substrate 13 in parallel stripes. N+ dopants are then implanted into the array area, such that the N+/p-Sub junction is located above the bottom of the shallow trenches. As such, buried N+ cathode lines 12 are self-aligned to the STIs and isolated from each other. The cathodes and buried layers 12 and STI 14 run parallel in a first direction along the surface of the substrate 13. The results are shown in FIG. 5A without illustrating the N+ implanted regions. Then as shown in FIG. 5B, over the substrate 13, STI regions 14 and cathodes/buried layers there is deposited a first layer of insulator 20, such as silicon dioxide, an intermediate sacrificial layer 21, such as silicon nitride, and second insulator layer 22, such as silicon dioxide. Thicknesses of the layers 20 and 22 range from 150 to 600 nm, corresponding to a total thickness of the desired PNPN thyristors. The sacrificial layer 21 thickness is in the range of 40 to 200 nm for the desired interconnect resistance.

Figure 5C:
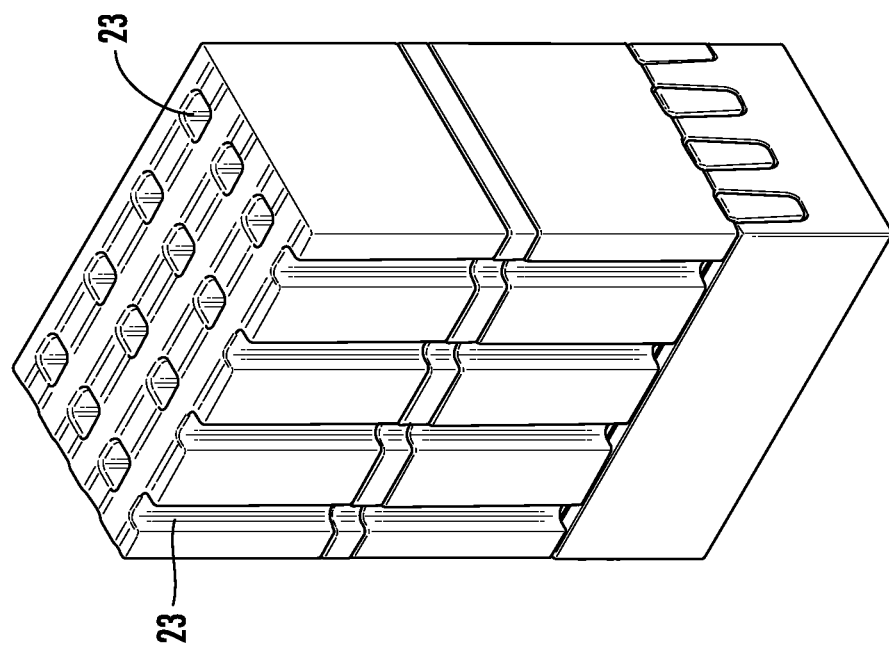
Figure 5F:
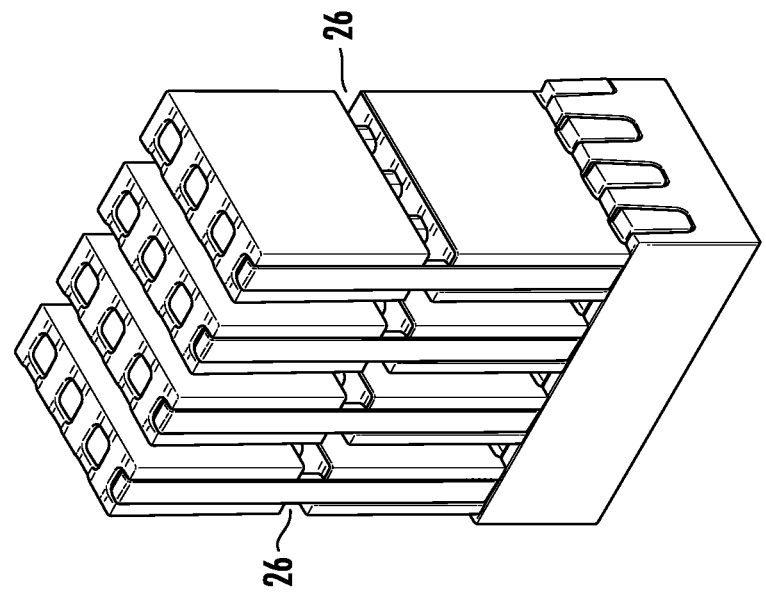

With masking and photolithography to define the locations of thyristor memory cells, reactive ion etching (RIE) is performed to create slots or holes 23 through the ONO (silicon Oxide-silicon Nitride-silicon Oxide or simply, Oxide-Nitride-Oxide) stack, i.e., the layers 20, 21 and 22, stopping at the underlying cathodes/buried layers 12 in the substrate 13. (It should be noted that in the description below silicon dioxide is described as silicon oxide or simply oxide, as a shorthand as well understood by practitioners in the field.) This is illustrated in FIG. 5C without the masking and photolithography layers which have been removed. The open slots or holes 23 are then filled with crystalline semiconductor, such as silicon, by a selective epitaxial growth (SEG) process which uses the silicon of the cathodes/buried layers 12 at the bottom of the slots or holes 23 as seeding silicon. Epitaxial pillars 24 are formed in the holes 23 as shown in FIG. 5D. The pillars 24 are formed with selectively doped NPNPNPN layers in the epitaxial growth process with in-situ doping.

Figure 5E:
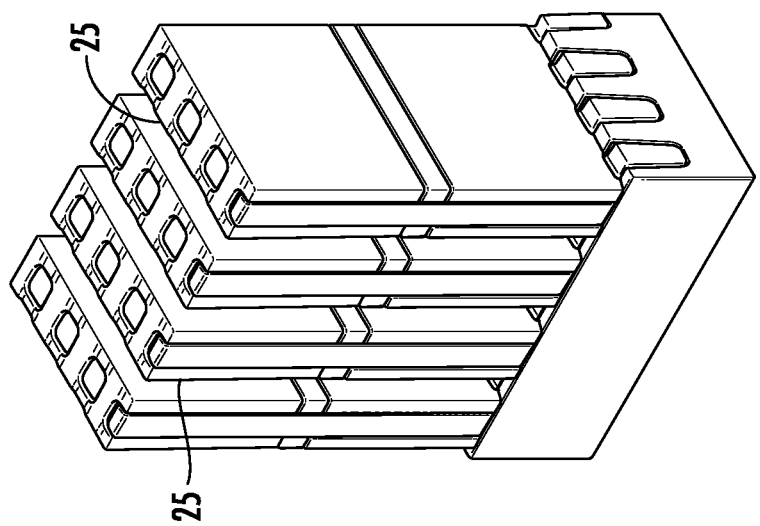

Then parallel slots 25 are etched down to the substrate 13 by an RIE step shown in FIG. 5E. The slots 25 run perpendicular to the cathodes/buried layers 12 and STI regions 14. This is followed by an isotropic etch, such as chemical wet etch, to remove the exposed nitride layer 21 leaving an open horizontal layer slice 26 shown in FIG. 5F. The epitaxial pillars 24 are exposed at the locations previously occupied by the nitride layer 21.

Figure 5H:
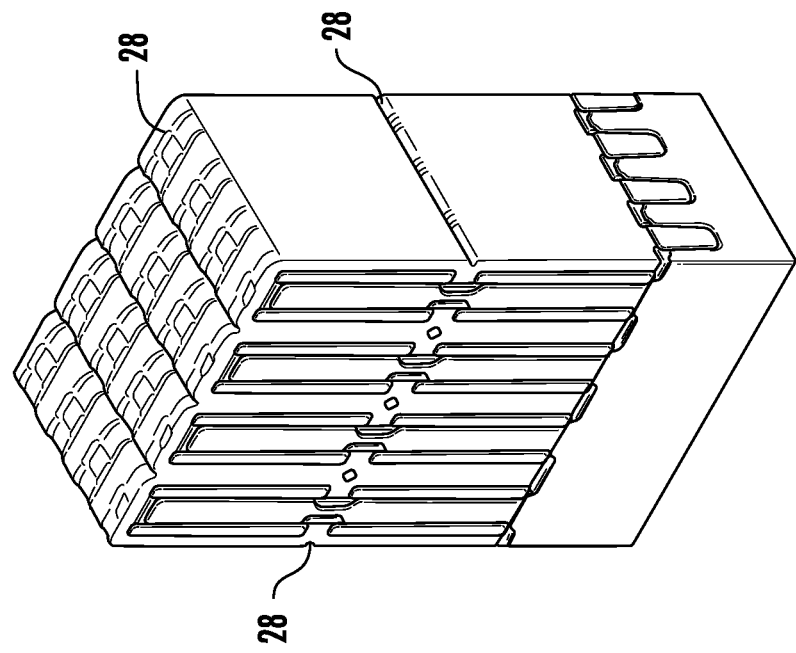
Figure 5G:
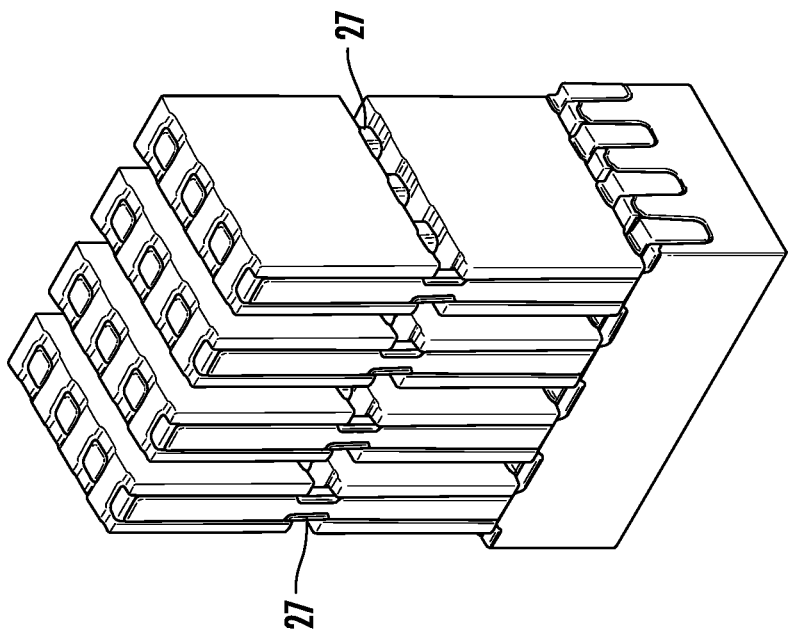
Figure 5J:
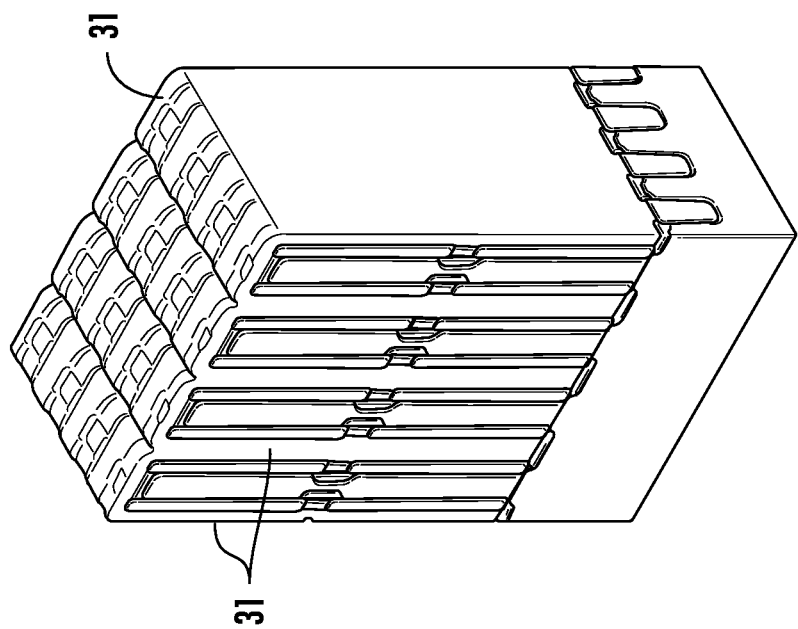
Figure 5I:
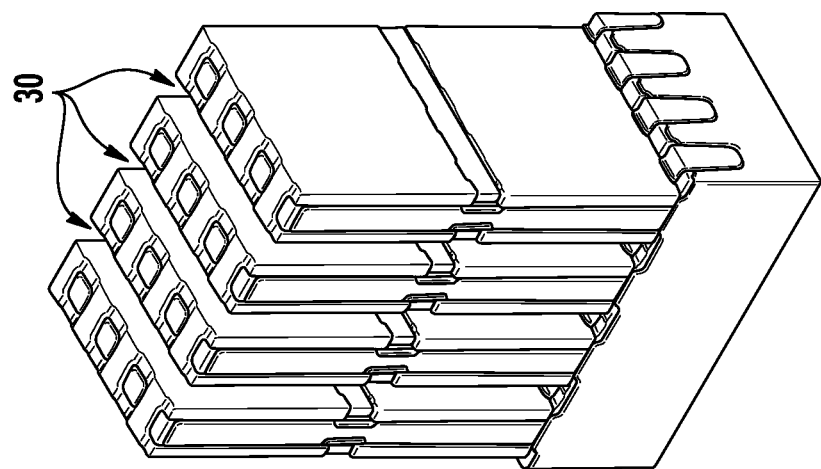

A transitional metal, such as cobalt, titanium or nickel, is then conformally deposited so that horizontal slice 26 is filled, along with the parallel slots 25 and that the transitional metal contacts the pillars 24. An anneal operation is performed so that the transitional metal forms a metal silicide 27 with the exposed portions of the pillars 24. A wet etch is then performed to remove the unreacted transitional metal. FIG. 5G shows the silicided portions 27 of the epitaxial pillars 24 in the reopened slice 26. A barrier metal, such as titanium nitride (TiN), followed by a conductor metal 28, such as tungsten (W), are then deposited. FIG. 5H shows the conductor metal 28 covering the tops and filling the slots 25 and the reopened slice 26. An etch back operation of the conductor metal 29 and underlying barrier metal is then performed which opens the slots 30 in the location of the slots 25. The barrier metal and conductor metal 25 remain in the slice 26 as illustrated in FIG. 5I and form the intermediate level lines in FIG. 1, for example. Further details of the formation of such intermediate lines 15 are described with respect to FIGS. 9-10. It is preferable that the width of the slot 25 be larger than the thickness of the layer 21 such that a conformal deposition of metal 28 completely fills cavities 26 but leaves a vertical space in slot 25. An isotropic etch of the conductor metal 29 can then be used to remove metal 29 from slot 25 while keeping the slice 26 filled.

Then an insulator material, such as silicon oxide or nitride, is then deposited to fill the slots 30 and followed by an optional etch back or planarization operation. The insulator-filled slots 31 are illustrated in FIG. 5J. An insulation layer 34 is then deposited over the top surface and a cell top masking and etching operation defines slots 32 in the layer 34. The slots 32 are over the exposed tops of the epitaxial pillars 24 as shown in FIG. 5K. Then a transitional metal, such as cobalt, titanium or nickel, is deposited, followed by an annealing operation to form a metal silicide over the tops of the epitaxial pillars 24. The unreacted transitional metal is removed and a barrier metal is deposited followed by the deposition of a conductor metal. A chemical-mechanical operation creates a set of parallel conducting lines 33 in the slots 32 in the insulating layer 34 as shown in FIG. 5L. The resulting semiconductor device is the same as that shown in FIG. 1, but including insulating dielectric material.

Process Flow for Two-Level Memory Cell Array with Assist-Gates

Figure 6B:
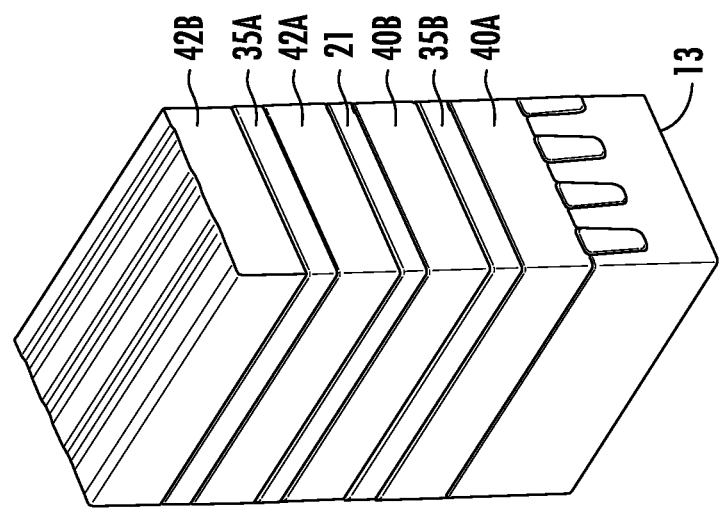
FIGS. 6A-6N illustrate manufacturing steps in the process flow to fabricate the semiconductor device of FIG. 2.
Figure 6A:
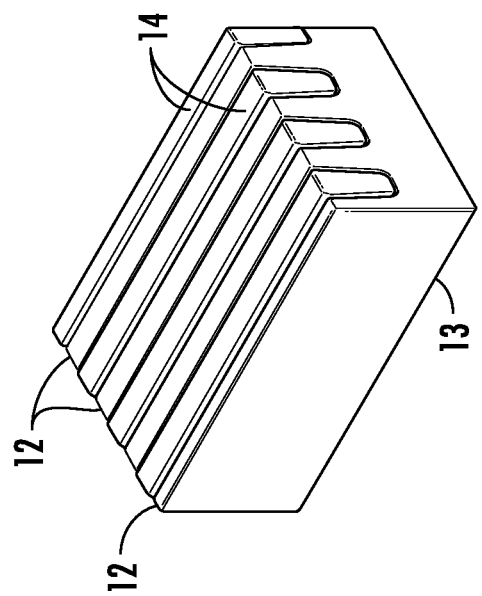
Figure 6D:
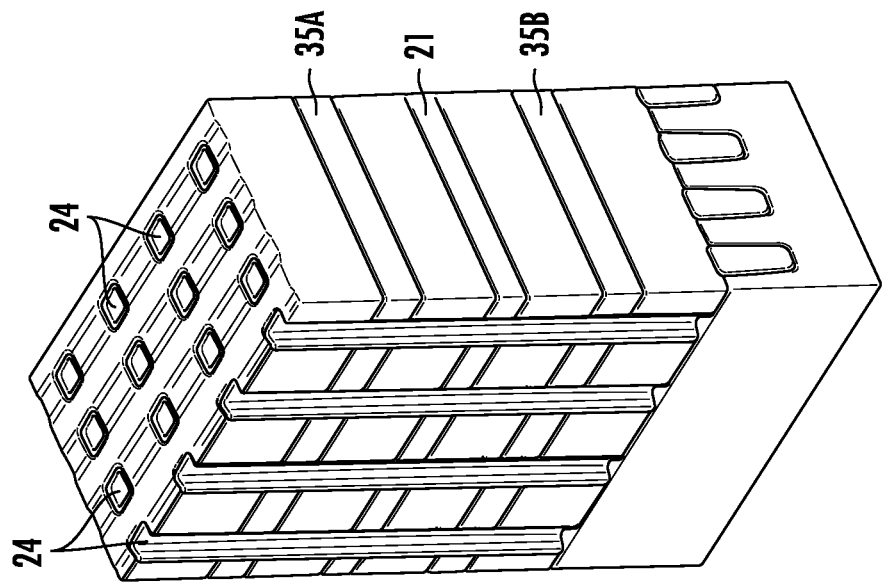
Figure 6C:
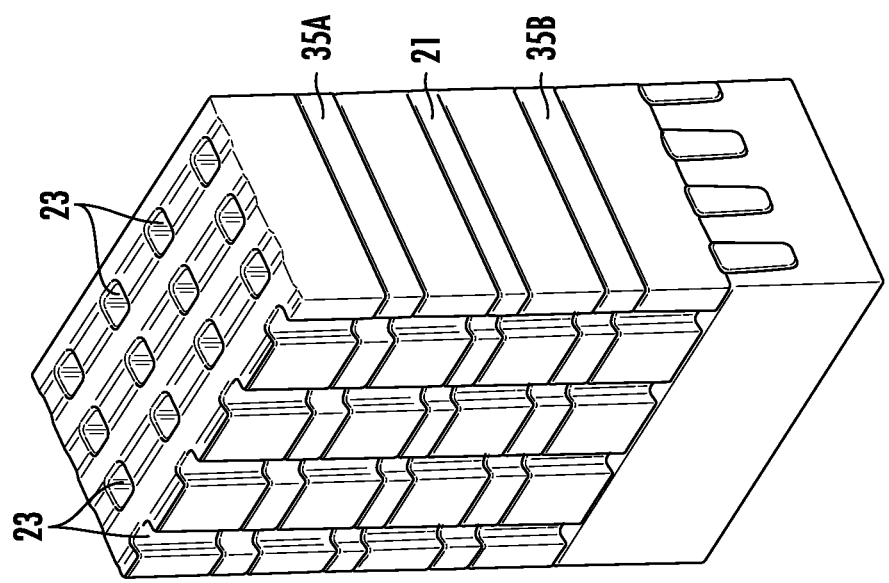
Figure 6E:
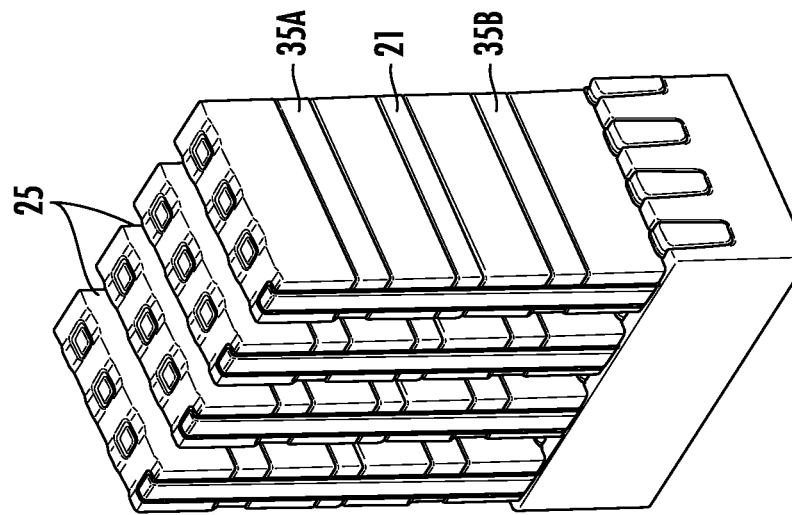
Figure 6F:
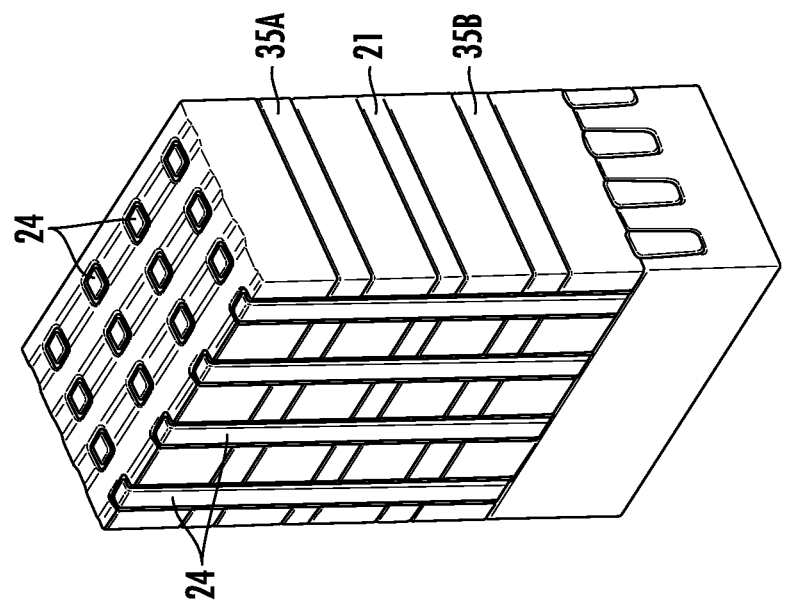
Figure 6J:
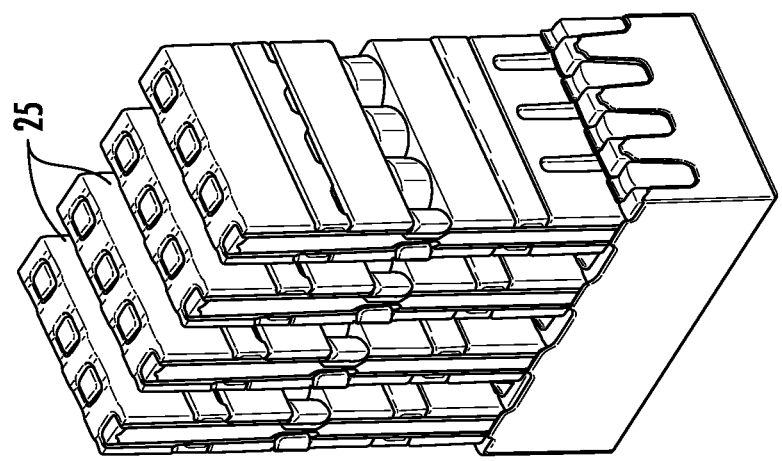
Figure 6I:
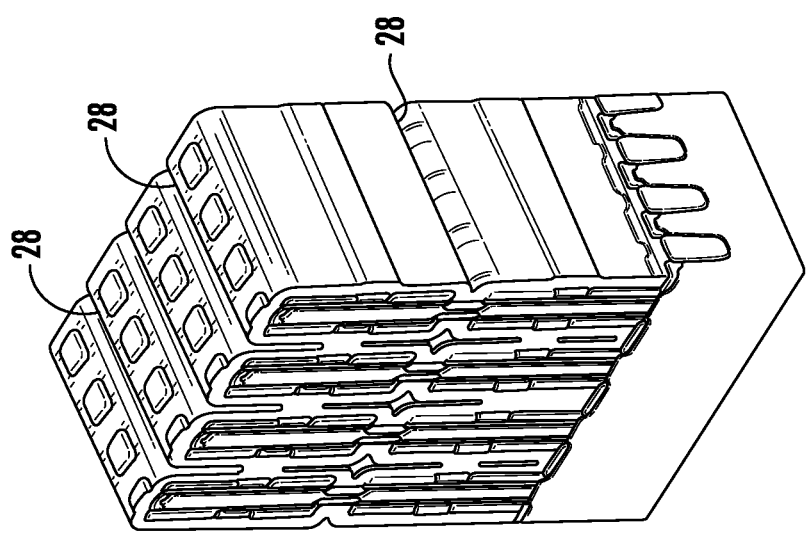
Figure 6N:
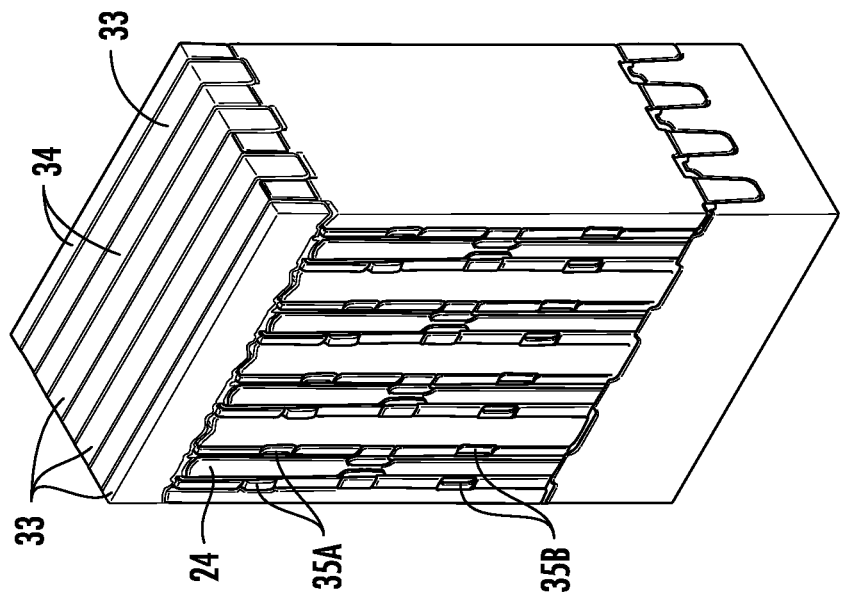
Figure 6M:
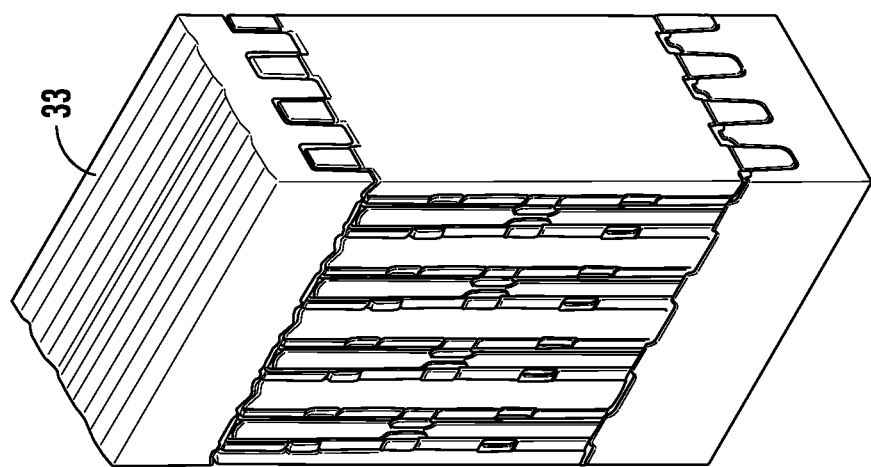

FIGS. 6A-6N show the process flow in manufacturing the two-level array of thyristor memory cells of FIG. 1 with assist-gates. The cell array is shown in FIG. 2 (without some of the insulating layers). The manufacturing process starts the same as with FIG. 1 semiconductor device. A P-doped semiconductor substrate 13 is implanted with N+ dopants in parallel lines to form interconnected cathodes and buried layers 12. The result shown in FIG. 6A is the same as FIG. 5A. Then OPONOPO layers, i.e., oxide layer 40A, polysilicon layer 35B, oxide layer 40B, nitride layer 21, oxide layer 42A, polysilicon layer 35A, and oxide layer 42B are deposited over the substrate 13, as illustrated in FIG. 6B. An exemplary thickness for each of the OPONOPO layers is 30 to 100 nm.

With masking and photolithography defining the locations of thyristor memory cells, reactive ion etching (ME) is used to etch slots or holes 23 through the OPONOPO (Oxide-Polysilicon-Oxide-Nitride-Oxide-Polysilicon-Oxide) stack to the underlying cathodes/buried layers 12 in the substrate 13. This is shown in FIG. 6C. Gate dielectric material, e.g., oxide, is conformally deposited over the semiconductor device and into the holes 23. An anisotropic etch step removes the gate dielectric material from the bottom, but not the sidewalls, of the holes 23, shown by FIG. 6D. The remaining gate dielectrical material forms the gate insulating layer for assist-gate electrodes (the polysilicon layers) 35A and 35B.

Then similar to the process step described with respect to FIG. 5D, the open holes 23 are then filled with crystalline semiconductor, such as silicon, by a selective epitaxial growth (SEG) process which uses the silicon of the cathodes/buried layers 12 at the bottom of the holes 23 as seeding silicon material to start the growth of epitaxial silicon in the holes 23. Epitaxial pillars 24 are formed in the holes 23 as shown in FIG. 6E. The pillars 24 are formed with selectively doped NPNPNPN layers in the epitaxial growth process with in-situ doping. The assist-gate electrodes 35A and 35B are respectively aligned with one of the doped layers defining the base regions of the thyristors 10A and 10B.

Then parallel slots 25 are etched down to the substrate 13 by an RIE step shown in FIG. 6F. The slots 25 run perpendicular to the cathodes/buried layers 12 and STI regions 14. An etch to trim the polysilicon layers 35A and 35B exposed in the slots 25 is preferred but optional. An isotropic etch, such as chemical wet etch, removes the exposed nitride layer 21 leaving the open horizontal slice 26 shown in FIG. 6G. The epitaxial pillars 24 are exposed at the locations previously occupied by the nitride layer 21. Then as previously described with respect to FIG. 5G, a transitional metal, such as cobalt, titanium or nickel, is then conformally deposited onto the entire surface including the horizontal slice 26, along with the parallel slots 25. The exposed pillars 24 are contacted by the transitional metal. An anneal operation is performed so that the transitional metal reacts with silicon to form a silicide 27 with the contacted portions of the pillars 24, as well as the exposed polysilicon layers 35A and 35B. A wet etch is then performed to remove the unreacted transitional metal. FIG. 6H shows the silicided portions 27 of the epitaxial pillars 24 in the reopened slice 26 and on the polysilicon layers 35A and 35B.

A barrier metal, such as titanium nitride (TiN), followed by a conductor metal 28, such as tungsten (W), are then conformally deposited. FIG. 6I shows the conductor metal 28 covering the tops and filling the slots 25 and the reopened slice 26. An etch back operation of the conductor metal 29 and underlying barrier metal is then performed which opens the slots 30 in the location of the slots 25 illustrated in FIG. 6J. The barrier metal and conductor metal 25 remain in the slice 26 and form the intermediate level lines 15 in FIG. 2. If the optional polysilicon trim etch has been performed, the conductor metal 25 also remains along the polysilicon lines 35A and 35B. As stated earlier, further details of the formation of such intermediate lines 15 are described with respect to FIGS. 9-10.

Then an insulator material, such as silicon oxide or nitride, is then deposited to fill the slots 25 and followed by an optional etch back or planarization operation. The insulator-filled slots 31 are illustrated in FIG. 6K. An insulation layer 34 is then deposited over the top surface and a cell top masking and etching operation define slots 32 in the layer 34. The slots 32 are over the exposed tops of the epitaxial pillars 24 as shown in FIG. 6L. Then a transitional metal, such as cobalt, titanium or nickel, is then deposited, followed by an annealing operation to form a metal silicide over the tops of the epitaxial pillars 24. The unreacted transitional metal is removed and a barrier metal (e.g., titanium nitride) is deposited followed by the deposition of a conductor metal (e.g., tungsten) shown by FIG. 6M. A chemical-mechanical-polishing (CMP) operation of the titanium nitride and tungsten layers then creates a set of parallel conducting lines 33 in the slots 32 in the insulating layer 34 as shown in FIG. 6N. The resulting semiconductor device is the same as that shown in FIG. 2, but including insulating dielectric material.

Process Flow for Four-Level Memory Cell Array

Figure 7B:
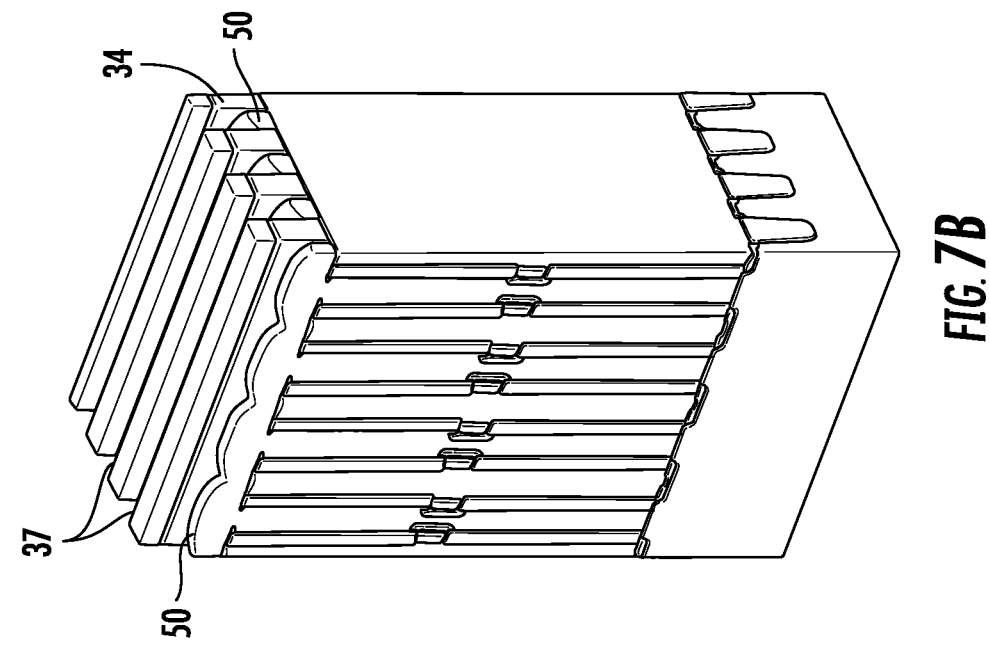
FIGS. 7A-7H illustrate manufacturing steps in the process flow to fabricate the semiconductor device of FIG. 3.
Figure 7A:
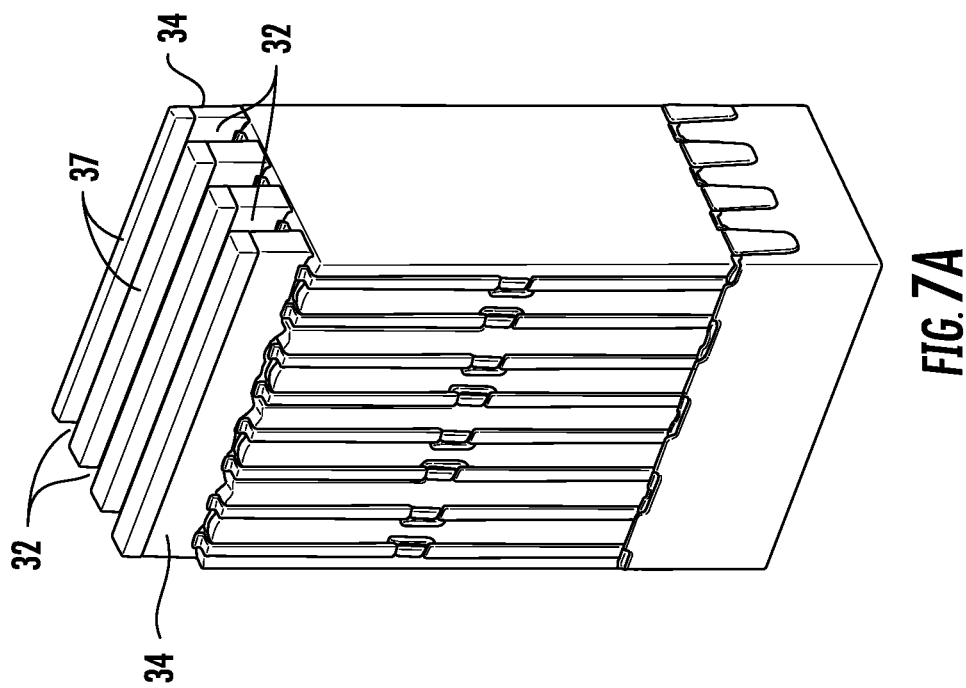

FIGS. 7A-7H illustrate the process flow in fabricating the four-level array of thyristor memory cells of FIG. 3. The described process flow begins with semiconductor device shown in FIG. 5K in a cell top masking and etching operation of the oxide layer 34 and nitride layer 37 defines slots 32 in the oxide layer 34. The slots 32 expose the tops of the epitaxial pillars 24 as shown in FIG. 7A.

Figure 7D:
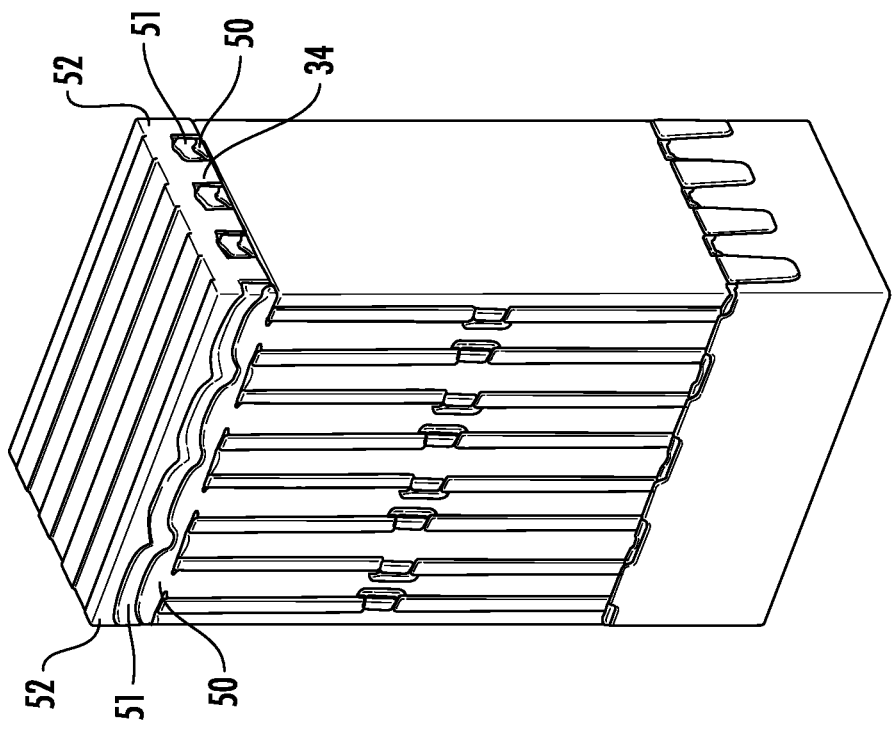
Figure 7C:
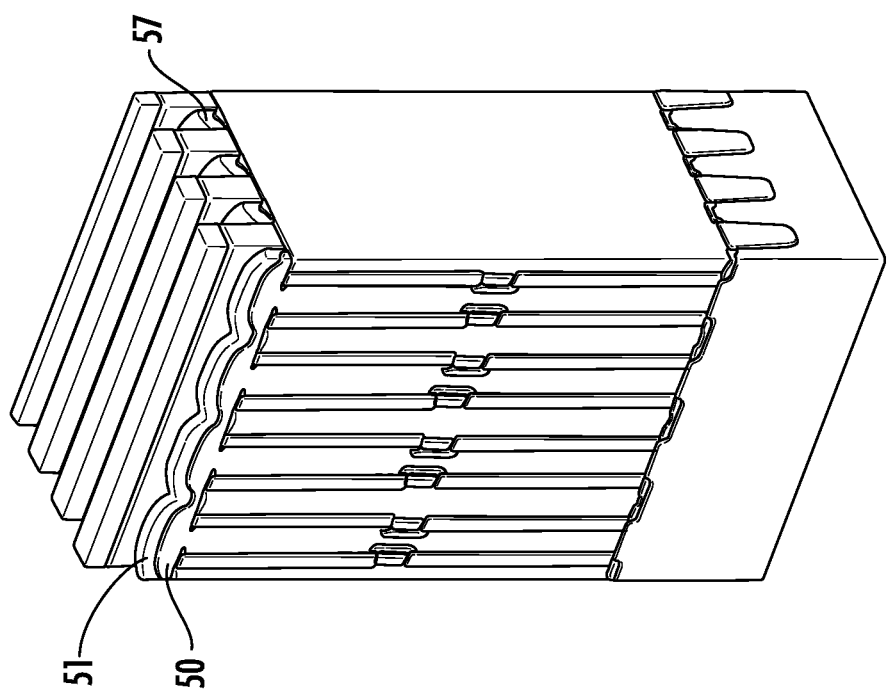

A selective epitaxial growth (SEG) step is performed growing epitaxial silicon from the tops of the epitaxial pillars 24 with epitaxial lateral overgrowth (ELO) 50 so that the epitaxial silicon 50 merge in the slots 32 as illustrated in FIG. 7B. Then a transition metal, e.g., cobalt, titanium, nickel, etc., is deposited for silicidation with the epitaxial material 31. After an anneal step, the unreacted metal is removed by a wet chemical etch. The resulting semiconductor device is shown in FIG. 7C.

Figures 7E, 7F:
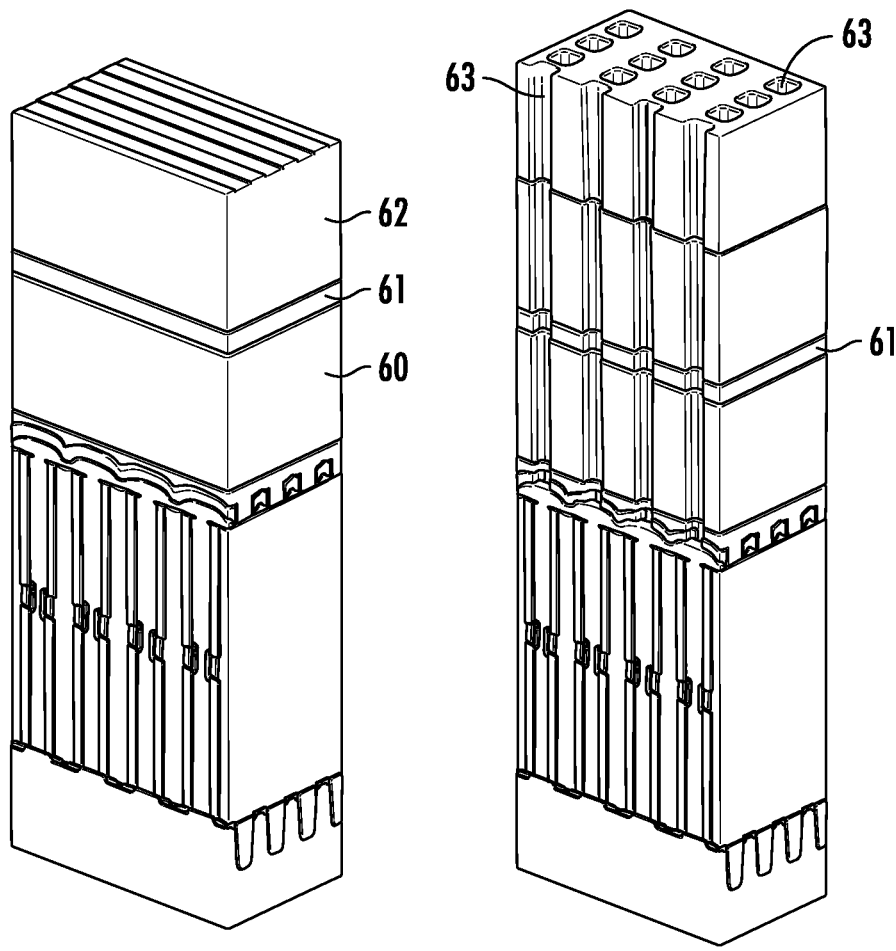

An oxide layer is deposited to fill the slots 34 and then a CMP step planarizes the deposited oxide layer and removes the nitride layer 37. The planarized oxide layer 52 is illustrated in FIG. 7D. Over the layer 52 an ONO layer stack is deposited with oxide layer 60, nitride layer 61 and oxide layer 62. The resulting structure of FIG. 7E is similar to that of FIG. 5A with an ONO structure resting on a semiconductor substrate, rather than a two-level stack of thyristor memory cells.

Figure 7G:
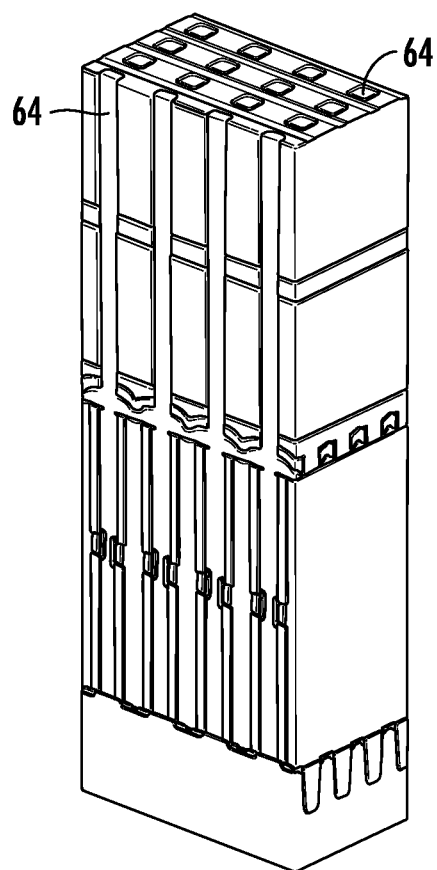

With masking and photolithography defining the locations of thyristor memory cells, reactive ion etching (RIE) is performed to etch slots or holes 63 through the ONO (Oxide-Nitride-Oxide) stack to the underlying ELO grown semiconductor layer 50 which acts as an etching stop. This is illustrated in FIG. 7F without the masking and photolithography layers which have been removed. The open holes 63 are then filled with crystalline semiconductor, such as silicon, by a selective epitaxial growth (SEG) process which uses the epitaxial silicon layer 50 at the bottom of the holes 63 as seeding silicon material to start the growth of epitaxial silicon in the holes 63. Epitaxial pillars 64 are formed in the holes 63 as shown in FIG. 7G.

Figure 7H:
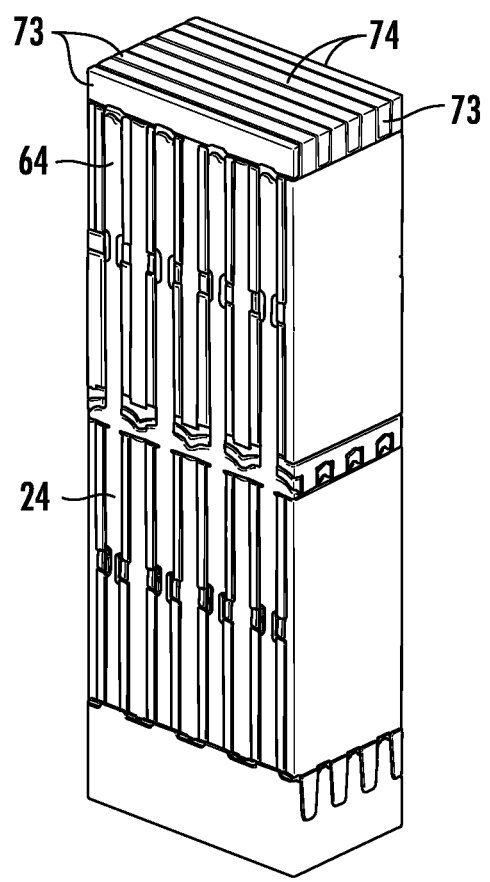

Then the same process flow is followed as described with respect to the two-level array of thyristor memory cells of FIGS. 5A-5L. FIG. 7H with metal lines 73 connected to the tops of the pillars 64 and separated by insulating material 74 shows the four-level array semiconductor device of FIG. 3 which includes all the insulating layers.

Process Flow for Four-Level Memory Cell Array with Assist-Gates

Figure 4:
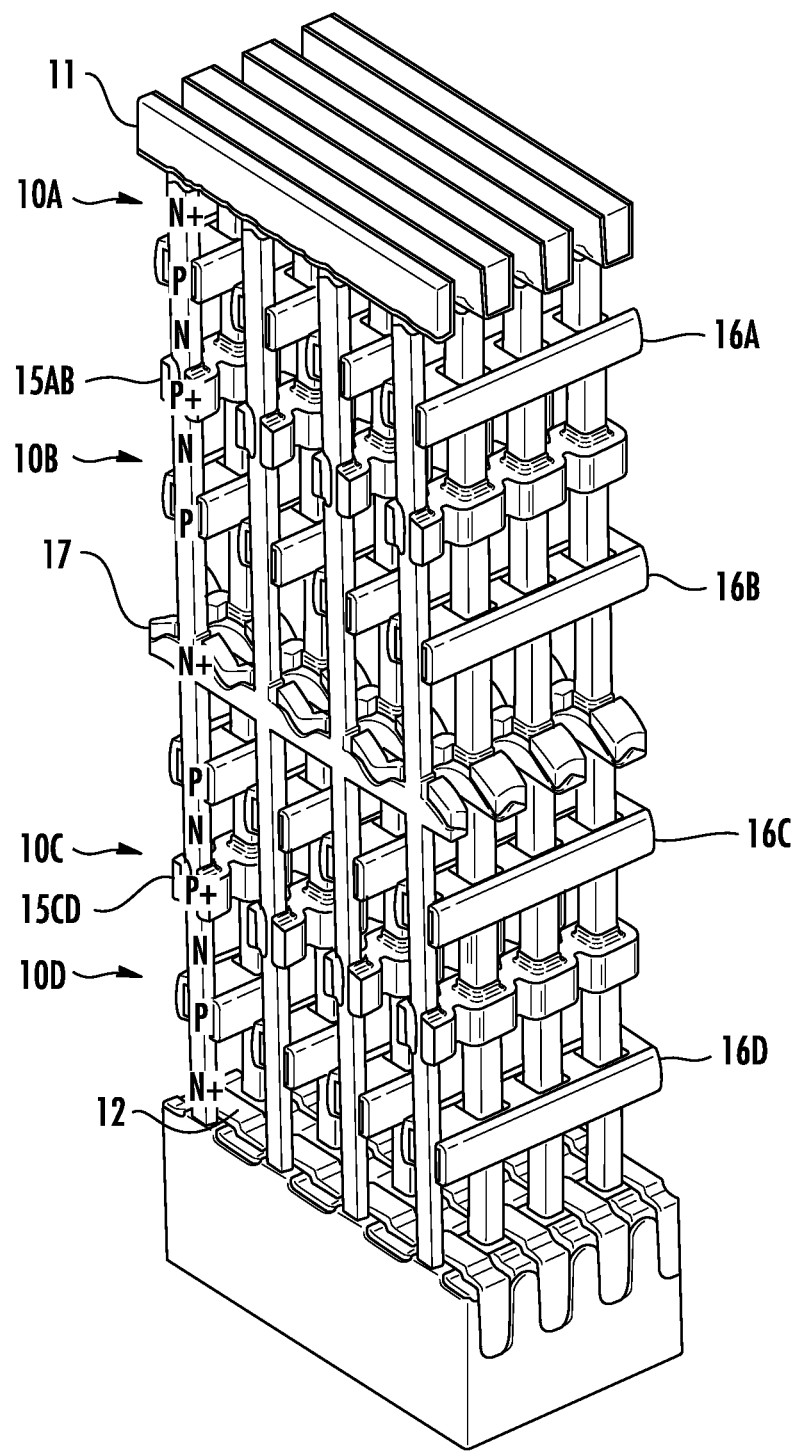
FIG. 4 is a perspective of a four-array stack of thyristor memory cells with assist-gates in each array.

The four-level array of thyristor memory cells can also be fabricated with assist-gates. FIGS. 8A-8J illustrate steps in manufacturing the four-level array of thyristor memory cells of FIG. 3 with assist-gates. The cell array is shown in FIG. 4 (without some of the insulating layers).

The described process flow begins with semiconductor device having a two-level array of thyristor memory cells with assist-gates shown in FIG. 7A. A cell top masking and etching operation of the oxide layer 34 and nitride layer 37 defines slots 32 in the oxide layer 34. The slots 32 expose the tops of the epitaxial pillars 24 as shown in FIG. 8A.

Figures 8A, 8B:
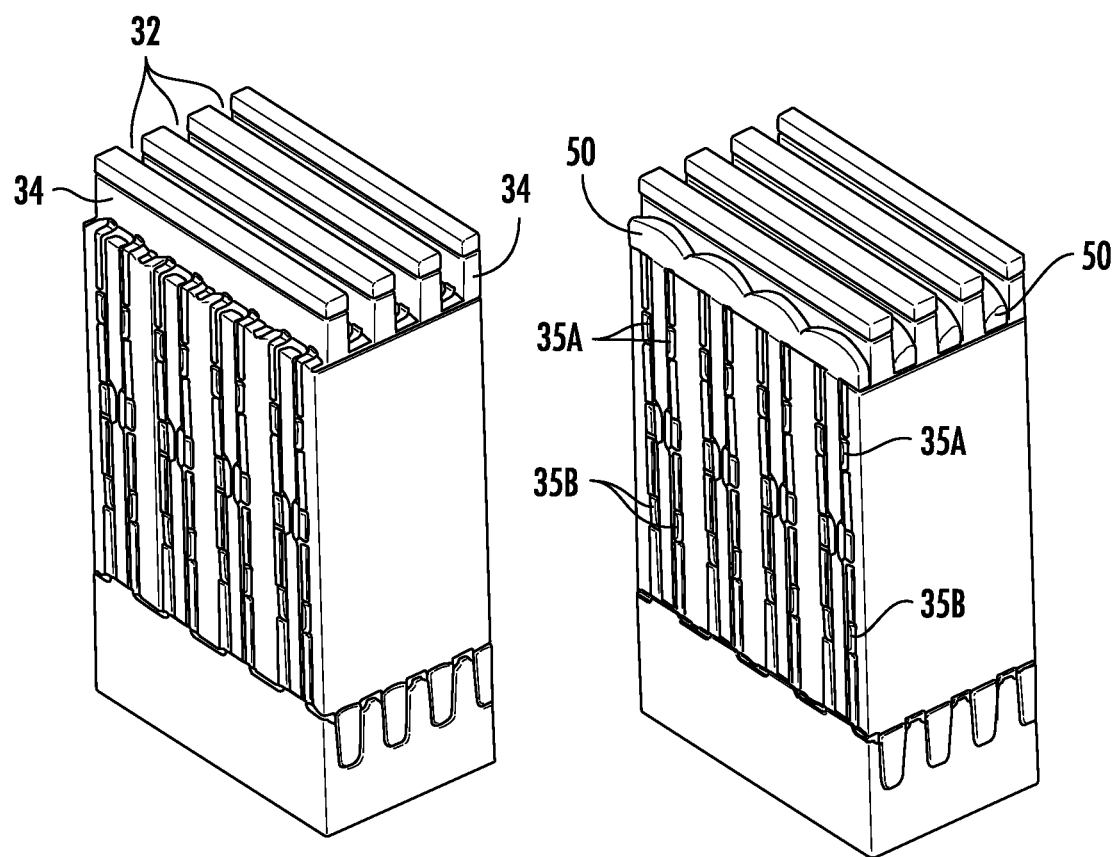
FIGS. 8A-8H illustrate manufacturing steps in the process flow to fabricate the semiconductor device of FIG. 4.
Figures 8C, 8D:
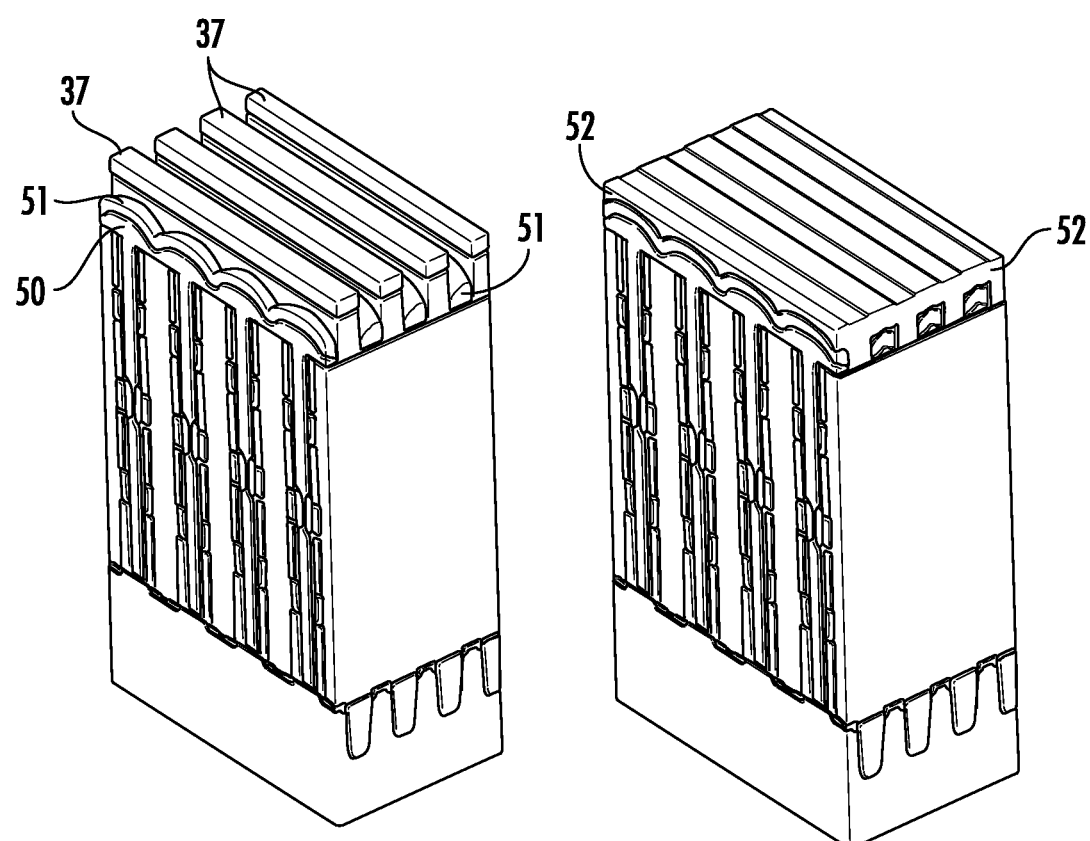

A selective epitaxial growth (SEG) step is performed growing epitaxial silicon from the tops of the epitaxial pillars 24 with epitaxial lateral overgrowth (ELO) 50 so that the epitaxial silicon 50 merge in the slots 32 as illustrated in FIG. 8B. Then a transition metal, e.g., cobalt, titanium, nickel, etc.) is deposited for silicidation with the epitaxial material. After an anneal step, the unreacted metal is removed by a wet chemical etch. The resulting semiconductor device is shown in FIG. 8C where 51 is the silicide.

Figure 8E:
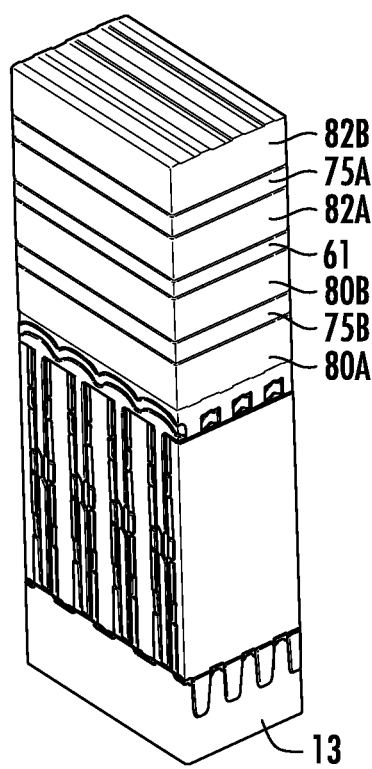

An oxide layer is deposited to fill the slots 32 and then a CMP step planarizes the deposited oxide layer and removes the nitride layer 37. The planarized oxide layer 52 is illustrated in FIG. 8D. Over the layer 52 an OPONOPO layer stack is deposited with oxide layer 80A, polysilicon layer 75B, oxide layer 80B, nitride layer 61, oxide layer 82A, nitride layer 75A and oxide layer 82B. The resulting structure of FIG. 8E is similar to that of FIG. 6B which has an OPONOPO structure resting on a semiconductor substrate, rather than a two-level stack of thyristor memory cells shown in FIG. 8E.

Figure 8F:
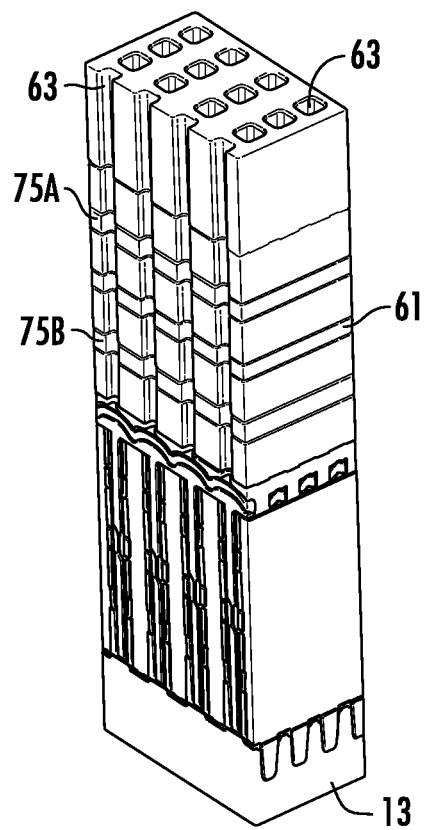
Figure 8G:
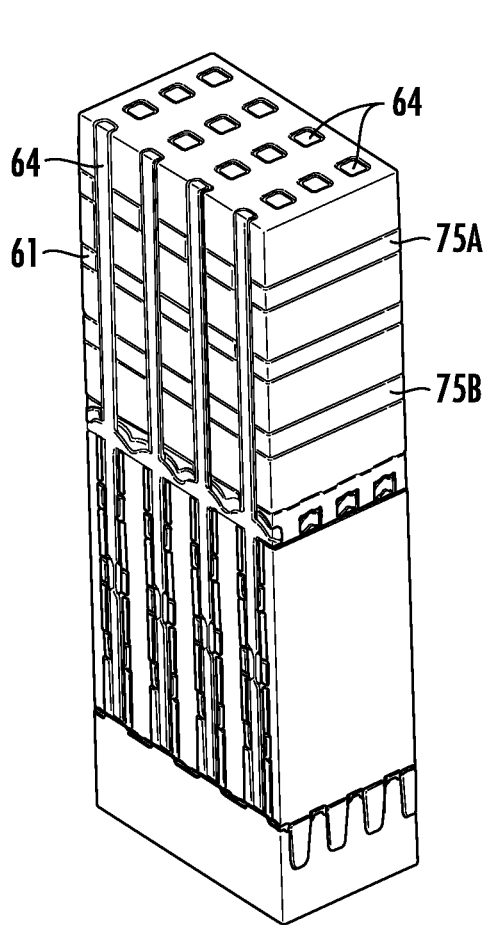

With masking and photolithography layers over the silicon oxide layer 82B and photolithography masking definition steps, the locations of thyristor memory cells are defined (none of which are shown). Reactive ion etching (RIE) is performed to etch holes 63 through the OPONOPO (Oxide-Polysilicon-Oxide-Nitride-Oxide-Polysilicon-Oxide) stack to the underlying ELO grown semiconductor layer 50. This is shown in FIG. 8F. Gate dielectric material, e.g., oxide, is conformally deposited over the semiconductor device and into the holes 63. An anisotropic etch step removes the gate dielectric material from the bottom, but not the sidewalls, of the holes 63, shown by FIG. 8F. The remaining gate dielectrical material forms the gate insulating layer for assist-gate electrodes (the polysilicon layers) 75A and 75B.

Figure 8H:
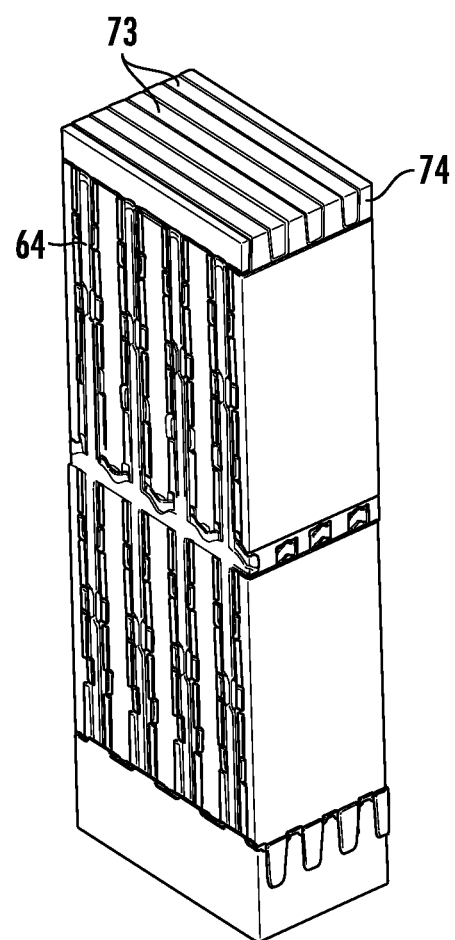

The process steps of the two-level stack of thyristor memory cells with assist-gates, illustrated by FIGS. 6D-6N) are repeated here. The resulting semiconductor device is illustrated by FIG. 8H.

Further Details on the Intermediate Conducting Lines for Two Levels of Memory Cell Arrays Further details about the formation of such intermediate conducting lines are explained with FIGS. 9A-9D. These intermediate conducting lines provide a method of forming an electrical connection to a region between a lower layer of semiconductor structure and an upper layer of semiconductor structure.

Figure 9B:
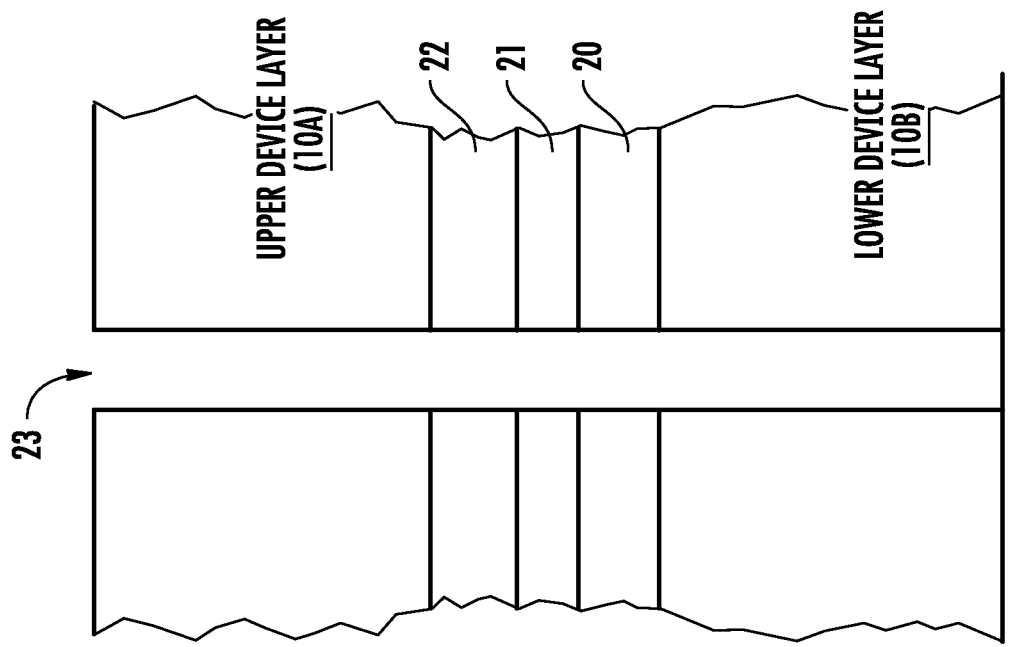
FIGS. 9A-9D show details of the intermediate conducting lines in the multiple level arrays of thyristor memory cells shown in the previous drawings.
Figure 9A:
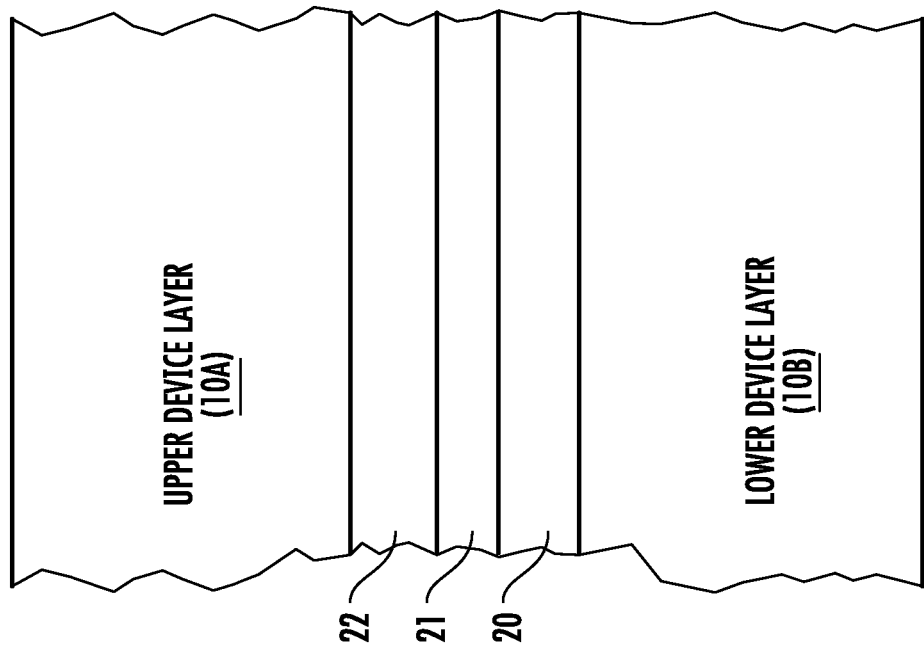
Figure 9D:
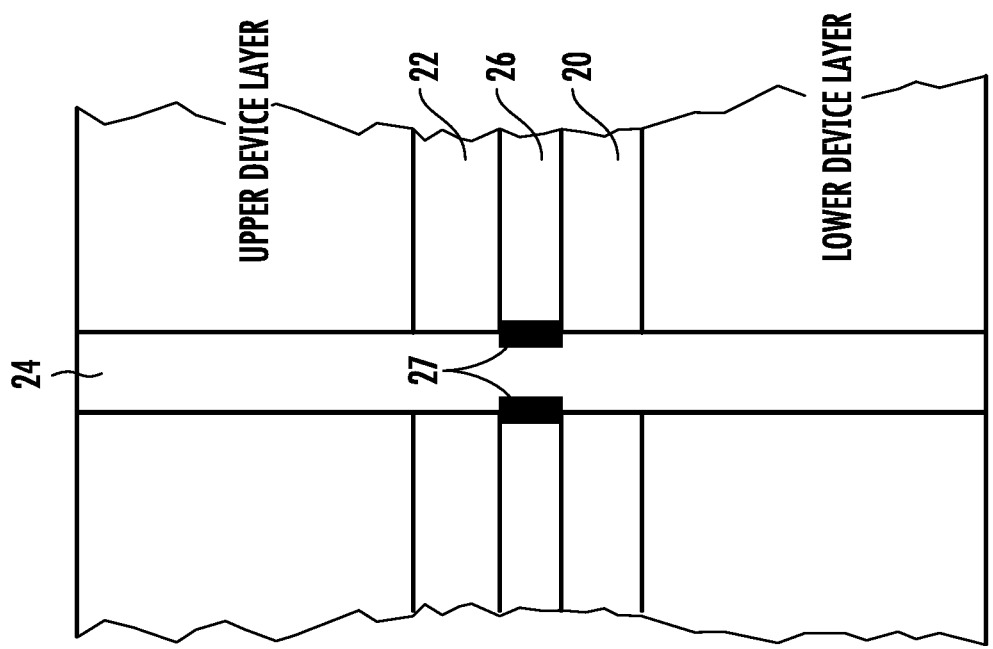

The drawings show a generalized structure of an ONO (oxide-nitride-oxide) layered stack which divides the semiconductor device structure into an upper layer for the top level array of thyristor memory cells and a lower layer for the bottom level array of cells. FIG. 9A shows the ONO layers (oxide layer 20, nitride layer 21 and oxide layer 22)

of the semiconductor device, such as illustrated by FIG. 5B. Then a slot or hole 23 at the location where a thyristor is to be formed is etched (by an RIE step) through the ONO structure to expose an underlying silicon surface. This is shown by FIG. 9B and in a previously described process flow, FIG. 5C. Here the Oxide-Nitride-Oxide materials are used as an example. Other materials may be used as long as the two materials which form the layered stack have a very high etch selectivity between them. For example, the nitride layer may be CVD (Chemical Vapor Deposition) carbon.

Figure 9C:
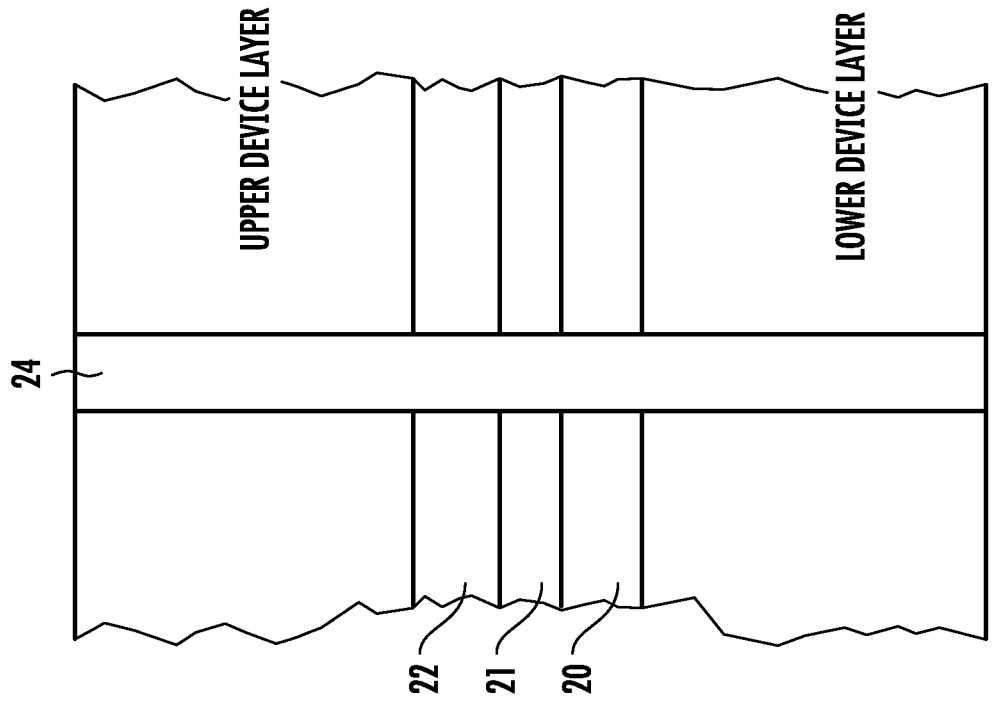

A selective epitaxial growth (SEG) process fills the slot or hole 23 with epitaxial silicon. The silicon at the bottom of the hole 23 seeds the silicon material to start the growth of epitaxial silicon in the hole 23. FIG. 9C shows the epitaxial silicon pillars 24 are formed in the holes 23. In the FIG. 5 process flow, FIG. 5D shows the silicon pillars 24. The pillars 24 are formed with selectively doped NPNPNPN layers in the epitaxial growth process with in-situ doping.

Subsequently parallel slots are etched through the ONO stack and an isotropic etch, such as a chemical wet etch, removes the remaining nitride layer 21 so that pillars 24 are exposed where the nitride layer 21 used to be. A transitional metal is conformally deposited to fill the layer slice vacated by the nitride layer 21. An anneal operation is performed so that the transitional metal forms a metal silicide 27 with the contacted portions of the pillars 24. Then the transitional metal is removed leaving an open layer slice 26 shown by FIG. 9D (and FIG. 5G). The open slice 26 is then filled with a barrier metal and conductor metal which are subsequently defined into an intermediate level line, such as line 15 of FIG. 1.

Figure 10A:
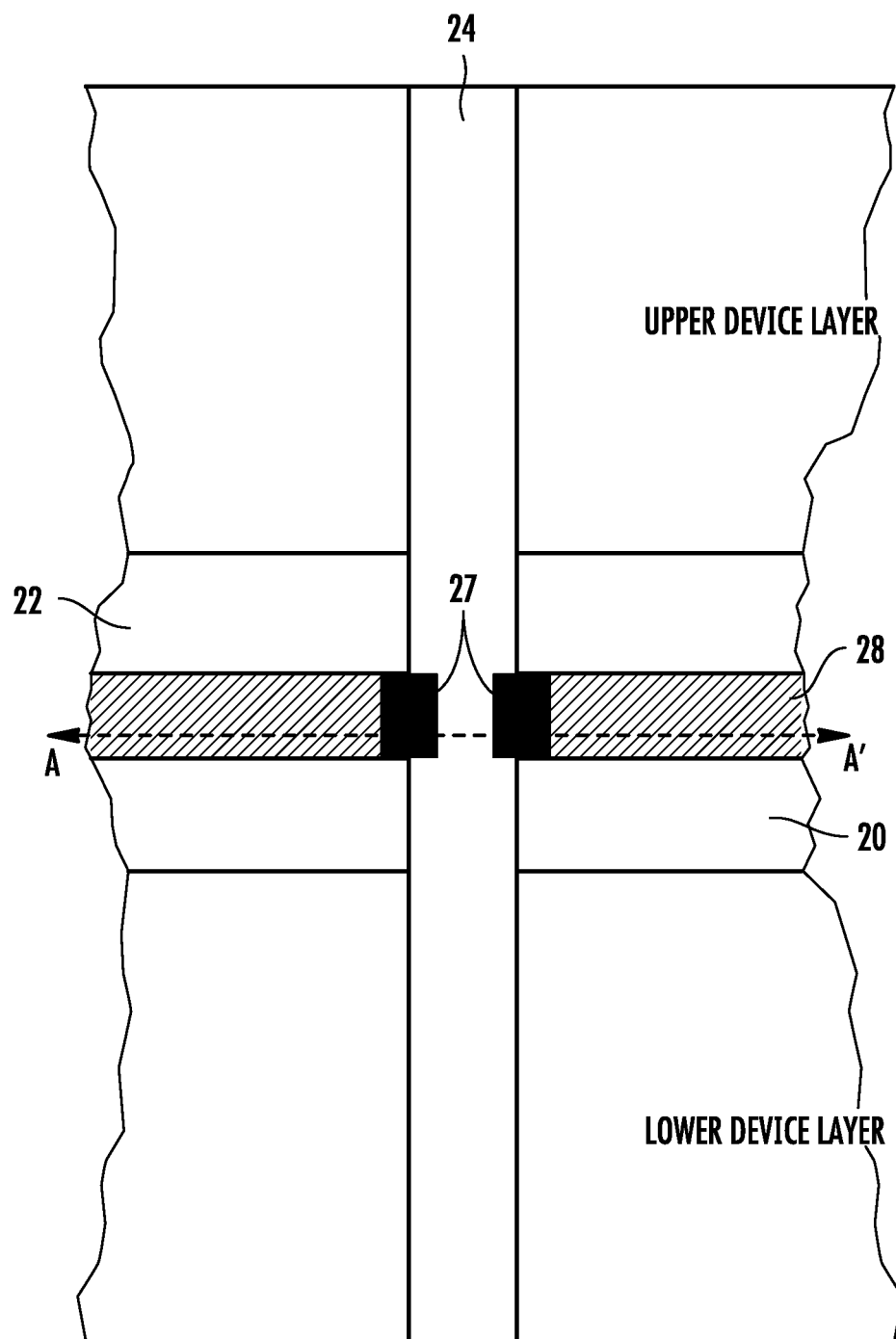
FIGS. 10A and 10B show structural details of the intermediate conducting lines of FIGS. 9A-9D.
Figure 10B:
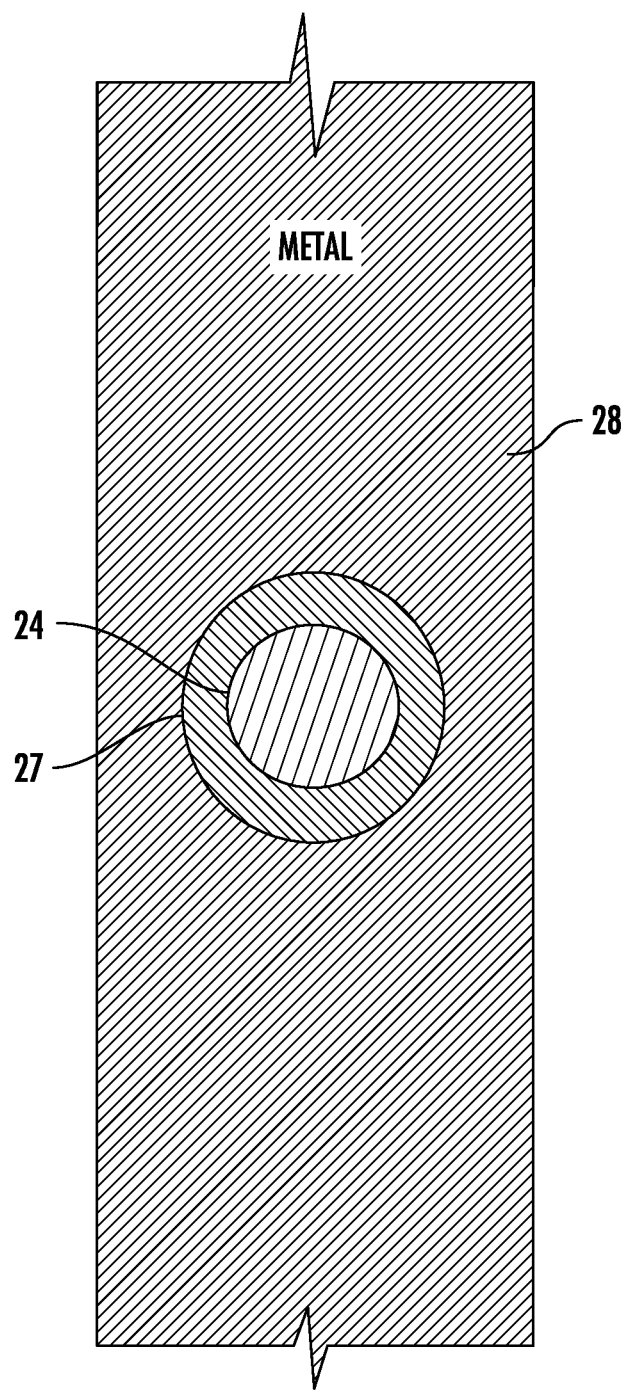

FIG. 10A shows a cross-sectional view of the resulting intermediate level line formed by the conducting metal 28 and silicide region 27 which contacts the middle doped region of the epitaxial silicon pillar 24. The barrier metal is not shown. Specifically in the semiconductor device of FIG. 1 the silicide region contacts the middle P region in the epitaxial silicon pillars 24. FIG. 10B is another cross-sectional view of the intermediate line along line A-A' in FIG. 10A which shows how the conducting metal 28 contacts the epitaxial silicon pillars 24 through the silicide region 27.

From the description of the intermediate conducting line with respect to ONO stack structures, it is readily evident that many of the same details are also applicable to other three-dimensional devices other than multiple level arrays of thyristor memory cells with or without assist-gates as described above.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of forming an electrical connection to a region between a lower layer of semiconductor structure and an upper layer of semiconductor structure, the method comprising:
    providing an intermediate layer structure of insulating material between the lower layer and the upper layer of semiconductor structure;
    forming an opening extending through the upper layer, the intermediate layer structure and at least some of the lower layer;
    filling the opening with a semiconductor material;
    removing at least a portion of the intermediate layer structure to create a space between the upper layer and the lower layer;
    forming a metal silicide layer with the semiconductor material in the space; and
    introducing a first metal into the space to connect to the metal silicide layer.

2. The method of claim 1 wherein the step of forming the metal silicide layer comprises:
    introducing a second metal into the space;
    reacting the second metal with the semiconductor material in the space; and
    removing any unreacted second metal from the space.

3. The method of claim 2 wherein the first metal comprises tungsten; and the second metal comprises cobalt or nickel.

4. The method of claim 1 wherein the intermediate layer structure of insulating material comprises a sandwich of silicon dioxide, silicon nitride and silicon dioxide; and the step of removing at least a portion of the intermediate layer structure includes removing the layer of silicon nitride only.

* * * * *